(12) United States Patent
Nakashima

(10) Patent No.: US 7,462,870 B2
(45) Date of Patent: Dec. 9, 2008

(54) MOLDED PACKAGE AND SEMICONDUCTOR DEVICE USING MOLDED PACKAGE

(75) Inventor: Shintaro Nakashima, Tokushima (JP)

(73) Assignee: Nichia Corporation, Anan-shi (JP)

(*) Notice: Subject to any disclaimer, the term of this patent is extended or adjusted under 35 U.S.C. 154(b) by 34 days.

(21) Appl. No.: 11/386,775

(22) Filed: Mar. 23, 2006

(65) Prior Publication Data
US 2006/0175716 A1   Aug. 10, 2006

Related U.S. Application Data

(63) Continuation of application No. 10/870,912, filed on Jun. 21, 2004, now Pat. No. 7,045,905.

(30) Foreign Application Priority Data

Jun. 20, 2003  (JP)  ............................. 2003-176556
Jun. 17, 2004  (JP)  ............................. 2004-179045

(51) Int. Cl.
   H01L 27/15   (2006.01)
   H01L 29/267  (2006.01)
   H01L 31/12   (2006.01)
   H01L 33/00   (2006.01)

(52) U.S. Cl. .......................................... 257/81; 257/99

(58) Field of Classification Search ............... 257/787, 257/666, 81, 99, 100
See application file for complete search history.

(56) References Cited

U.S. PATENT DOCUMENTS

| | | | |
|---|---|---|---|
| 3,509,430 A | | 4/1970 | Mroz |
| 3,566,208 A | | 2/1971 | Wang |
| 5,309,460 A | | 5/1994 | Fujimaki et al. |
| 5,335,642 A | * | 8/1994 | Hancock et al. ............. 123/634 |
| 5,367,530 A | | 11/1994 | Noishiki et al. |
| 5,859,387 A | | 1/1999 | Gagnon |
| 6,054,716 A | * | 4/2000 | Sonobe et al. ............. 250/552 |
| 6,084,252 A | * | 7/2000 | Isokawa et al. ............. 257/98 |
| 6,924,514 B2 | * | 8/2005 | Suenaga ..................... 257/98 |
| 6,943,433 B2 | * | 9/2005 | Kamada ..................... 257/666 |
| 2004/0075100 A1 | | 4/2004 | Bogner et al. |
| 2004/0256706 A1 | | 12/2004 | Nakashima |
| 2005/0269591 A1 | * | 12/2005 | Hsin Chen et al. ............ 257/99 |
| 2006/0250790 A1 | * | 11/2006 | Mah et al. .................... 362/157 |
| 2006/0267042 A1 | * | 11/2006 | Izuno et al. .................. 257/100 |
| 2007/0193763 A1 | * | 8/2007 | Parkhill et al. ................ 174/32 |
| 2007/0207384 A1 | * | 9/2007 | Nakura .................... 429/231.1 |

FOREIGN PATENT DOCUMENTS

| JP | 2000-188425 A | 7/2000 |
|---|---|---|
| WO | 02/084749 A | 10/2002 |

* cited by examiner

*Primary Examiner*—S. V Clark
(74) *Attorney, Agent, or Firm*—Smith Patent Office

(57) ABSTRACT

A molded package comprises at least a first metal member, a second metal member, and a third metal member. Each member includes an end portion inserted into a mold member where a recess is formed and another end portion protruding from an outer wall of the mold member. A portion of each main surface of the metal members is exposed from the mold member in the bottom of the recess. A portion of each main surface can be also divided into at least two bonding regions by a wall portion comprising part of the mold member. A semiconductor device of the present invention comprises the molded package, a semiconductor component, and an encapsulating member covering the semiconductor component, and has a high reliability.

37 Claims, 11 Drawing Sheets

MOLDED PACKAGE AND SEMICONDUCTOR DEVICE USING MOLDED PACKAGE

CROSS REFERENCE TO RELATED APPLICATIONS

This application is a continuation application of U.S. patent application Ser. No. 10/870,912 filed on Jun. 21, 2004, now U.S. Pat. No. 7,045,905. The disclosure of U.S. patent application Ser. No. 10/870,912 is hereby incorporated by reference.

BACKGROUND OF THE INVENTION

1. Field of the Invention

The present invention relates to a molded package comprising a metal member such as a lead electrode which supplies electric power to a semiconductor element incorporated into the mold member by way of insert molding, and further to a semiconductor device using the molded package as a support member.

2. Discussion of the Related Art

Conventionally, there has been a semiconductor device in which a light emitting semiconductor element, a protective element which protects the light emitting semiconductor element from a damage caused by overvoltage, and a plurality of semiconductor elements are housed in a recess of a molded package. In such a semiconductor device, a semiconductor element and a conductive wire which supplies electric power to the semiconductor element are connected to the surface of a metal member such as a lead electrode exposed in the recess of the molded package by way of die bonding or wire bonding. Further, the recess is encapsulated with a resin so as to cover the semiconductor element and the conductive wires, for the purpose of protecting them from the external environment. (For instance, see Japanese Patent Publication No. 2000-188425)

However, the thermal expansion coefficients of the metal member exposed in the recess of the molded package and the resin which encloses the recess are different, and so problems such as cracking at their interface occur. Such cracking may result in the resin falling out of from the molded package. Also, a gap created by the cracking adversely affects the optical properties of the light emitting device. Further, when the thermal stress exerted from the resin concentrates on the bonding portion of the conductive wires, the portion may detach from the surface of the lead electrode. This causes disconnection of the semiconductor element from the external electrode. Such problems become more significant when the number of semiconductor elements housed in the molded package increases. This is because a larger die bonding area is required for the corresponding lead electrodes and the number of wire bonds increase.

Therefore, an object of the present invention is to solve the problems described above and provide a semiconductor device having a high reliability.

SUMMARY OF THE INVENTION

After performing various tests to solve the problems described above, the inventor has accomplished the present invention. The present invention overcomes the problems described above and has the following effects described below.

The present invention relates to a molded package comprising a molded member having a recess formed therein with a bottom surface and a side surface surrounding thereof, a first member extending outward from at least part of the bottom surface in the recess of the molded member, a second member extending outward from at least a part of the bottom surface and the side surface of the recess of the molded member, and a third member extending outward from at least a part of the bottom surface and the side surface of the recess of the molded member, wherein at least one of the second member and the third member is divided into at least two portions by a wall portion.

With this construction, detachment of the mold member and disconnection of the conductive wires can be prevented. Also, the wall portion which is formed to separate the bonding regions prevents an adhesive material which is used for die bonding a semiconductor component from flowing into the bonding region of the conductive wires, and improves workability in the production process of the semiconductor device. Here, the bonding regions are the exposed portions of the second member and the third member each disposed on the bottom surface and the side surface in the recess of the molded member.

The present invention also relates to a molded package comprising a molded member having a recess formed therein with a bottom surface and a side surface surrounding thereof, a first member extending outwardly from at least part of the bottom surface in the recess of the molded member, a second member extending outwardly from at least a part of the bottom surface and the side surface of the recess of the molded member, and a third member extending outwardly from at least a part of the bottom surface and the side surface of the recess of the molded member, wherein the second member and the third member are divided into two portions by a wall portion.

With this, the exposed areas of the second member and the third member can be widened and the workability in the semiconductor device production can be improved. Also, the strength of the wall portion can be enhanced.

The wall portion is preferably formed continuously with the molded member. As a result, the strength of the wall portion can be enhanced.

The first member is preferably exposed from at least a part of the bottom surface in the recess of the molded member. With this construction, the heat dissipation of the molded package having the semiconductor component mounted thereon can be improved.

It is preferable that a second recess defined by a bottom surface and a side surface surrounding thereof is formed in the inner bottom surface of the recess of the molded member. With this construction, the luminous efficiency in the direction of the opening of the recess can be improved.

The present invention relates to a light emitting device comprising a light emitting element, a molded member having a recess formed therein by a bottom surface and a side surface surrounding thereof so as to mount the light emitting element, a first member extending outward from at least a part of the bottom surface in the recess of the molded member, a second member extending from at least a part of the bottom surface and the side surface of the recess of the molded member, a third member extending outward from at least part of the bottom surface and the side surface of the recess of the molded member, and a fourth member each electrically connects the light emitting element and the second member, the light emitting element, and the third member respectively.

With this construction, detachment of the encapsulating member and disconnection of the conductive wires can be prevented. Thus, a semiconductor device with a high reliability can be obtained.

The present invention also relates to a light emitting device comprising, a light emitting element, a molded member having a recess formed therein by a bottom surface and a side surface surrounding thereof so as to mount the light emitting element, a first member extending outward from at least a part of the bottom surface in the recess of the molded member, a second member extending from at least a part of the bottom surface and the side surface of the recess of the molded member, a third member extending outward from at least part of the bottom surface and the side surface of the recess of the molded member, and a fourth member electrically connects the light emitting element and the second member, the light emitting element, and the third member respectively, wherein the second member and the third member is divided into two portions by a wall portion.

As a result, the exposed areas of the second member and the third member can be widened and the workability in the semiconductor device production can be improved.

The wall portion is preferably formed continuous with the molded member. By this structure, the strength of the wall poriton can be enhanced.

It is preferable that a second recess defined by a bottom surface and a side surface surrounding thereof is formed in the inner bottom surface of the recess of the molded member, and the light emitting element is mounted in the bottom surface of the second recess. This is because the luminous efficiency in the direction of the opening of the recess can be improved.

The fourth member is preferably a conductive wire which is located below the top surface of the wall portion. That is, the height of the wall portion is preferably higher than the conductive wires. With this construction, the stress generated by the encapsulating member is more concentrated in the direction of the wall portion than the metal piece of the conductive wires. Therefore, the conductive wires can be prevented from separating from the lead electrode so that the semiconductor device with high reliability can be obtained.

The light emitting device may have a construction wherein a protective element is mounted on the third member so as to protect the light emitting element from overvoltage, and the second member is electrically connected to the protective element. With this construction, the stress generated by the encapsulating member is concentrated in the direction of the wall portion. Therefore, the conductive wires can be prevented from separating from the lead electrode so that the semiconductor device having a high reliability can be obtained.

The protective element comprises a back electrode which is mounted on the bonding region. By this construction, the number of the conductive wires can be reduced and the risk of detachment of the conductive wires can be reduced. Therefore, the semiconductor device having a high reliability can be obtained.

The light emitting device may have a construction wherein a protective element is mounted on the third member so as to protect the light emitting element from overvoltage. The third member is electrically connected to the fourth member which is electrically connected to the light emitting element. Also the protective element and the fourth member are separated into at least two regions by the wall portion. With this construction, the stress generated by the encapsulating member is concentrated in the direction of the wall portion. Therefore, the conductive wires can be prevented from being detached from the lead electrode and the semiconductor device with a high reliability can be obtained.

The light emitting device may also have a construction wherein a protective element is mounted on the third member so as to protect the light emitting element from overvoltage. The second member has a portion connected to the fourth member and a portion electrically connected to the protective element where the fourth member is electrically connected to the light emitting element. Also each portion is divided into at least two regions by the wall portions. With this construction, the stress generated by the encapsulating member is concentrated in the direction of the wall portion. Therefore, the conductive wires can be prevented from being detached from the lead electrode and the semiconductor device with a high reliability can be obtained.

The light emitting device may further have a construction wherein a protective element is mounted on the third member so as to protect the light emitting element from overvoltage. The third member is electrically connected to the fourth member which is electrically connected to the light emitting element. Further, the second member is electrically connected to the fourth element where the fourth member is electrically connected to the light emitting element. Also the second member and the third member are divided into two regions by the wall portion. With this construction, the stress generated by the encapsulating member is concentrated in the direction of the wall portion. Therefore, the conductive wires can be prevented from detached from the lead electrode and the semiconductor device with high reliability can be obtained.

It is preferable that a recess defined by a bottom surface and a side surface surrounding thereof is formed in the molded member, and an encapsulating member is contained in the molded member so as to enclose the light emitting element. With this construction, the light extraction efficiency of emission from the light emitting element can be improved.

The encapsulating member preferably includes a first encapsulating member and a second encapsulating member in sequence from the light emitting element side. The second encapsulating member is more rigid than the first encapsulating member. With this construction, the effect of protecting the semiconductor component and the conductive wires from an external impact can be enhanced.

It is preferable that the first encapsulating member is a gel silicone resin and the second encapsulating member is a silicone resin. With this arrangement, the effect of protecting the semiconductor component and the conductive wires from an external impact can be enhanced, and adhesion of dust to the gel silicone resin can be prevented.

The light emitting device may have a construction wherein the first encapsulating member is disposed in the second recess so as to enclose the light emitting element, and the second encapsulating member is disposed in the recess formed by a bottom surface and a side surface surrounding thereof in the molded member so as to enclose the first encapsulating member. With this construction, the effect of protecting the semiconductor component and the conductive wires from an external impact can be enhanced.

The encapsulating member may also include a fluorescent material which is capable of absorbing light emitted from the light emitting element and converting the wavelength of light to a different wavelength than that of the absorbed light. When the semiconductor device comprises the light emitting element and a fluorescent material, the fluorescent material can be disposed stably near the light emitting element by disposing the fluorescent material in the recess. An example of the fluorescent material comprises Al and at least an element selected from Y, Lu, Sc, La, Gd, Tb, Eu, Ga, In, and Sm, and activated with at least an element selected from the rare earth elements. The fluorescent material absorbs a part of the light emitted from the light emitting element and emits light with a different wavelength from the absorbed light. With this construction, the semiconductor device capable of emitting a mixed light including light emitted from the light emitting element and the light emitted from the fluorescent material can be obtained.

Another example of the fluorescent material comprises N, at least an element selected from Be, Mg, Ca, Sr, Ba, and Zn, and at least an element selected from C, Si, Ge, Sn, Ti, Zr, and Hf, and activated with at least an element selected from the rare earth elements. The fluorescent material absorbs a part of the light emitted from the light emitting element and emits light with a different wavelength from the absorbed light. With this construction, the semiconductor device capable of emitting a mixed light including light emitted from the light emitting element and the light emitted from the fluorescent material can be obtained. Also the color rendering properties of the mixed light can also be improved.

DETAILED DESCRIPTION OF THE PREFERRED EMBODIMENTS

Figure 1:
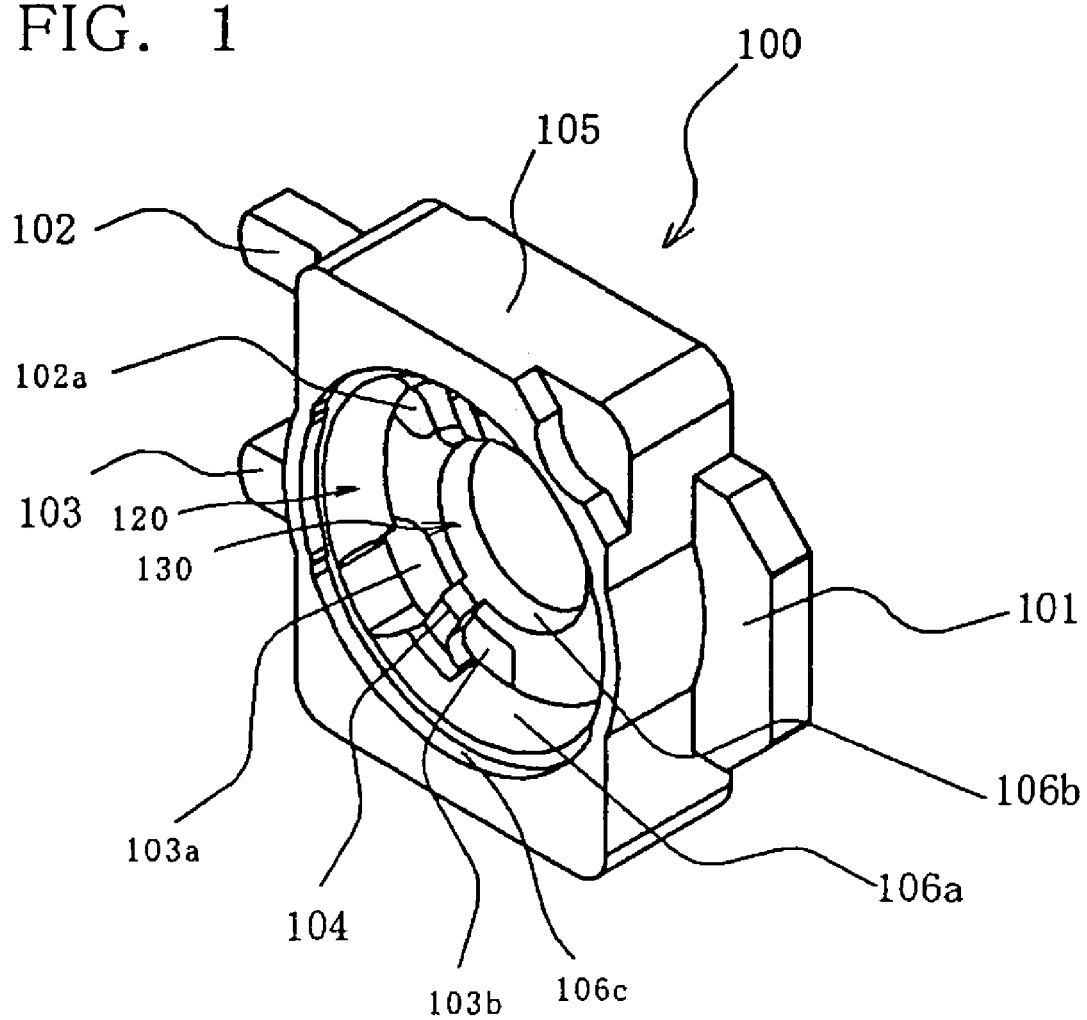
FIG. 1 is a schematic perspective view of a molded package according to an embodiment of the present invention.

The preferred embodiments of the present invention will be described in detail below with reference to the accompanying drawings. The preferred embodiments are described herein to exemplify the molded package and the semiconductor device so as to materialize the technical idea of the present invention. However, the present invention is not limited to the embodiments. In the drawings, the size and the physical relationship of the components are exaggerated for clarity.

Embodiment 1

Figure 2:
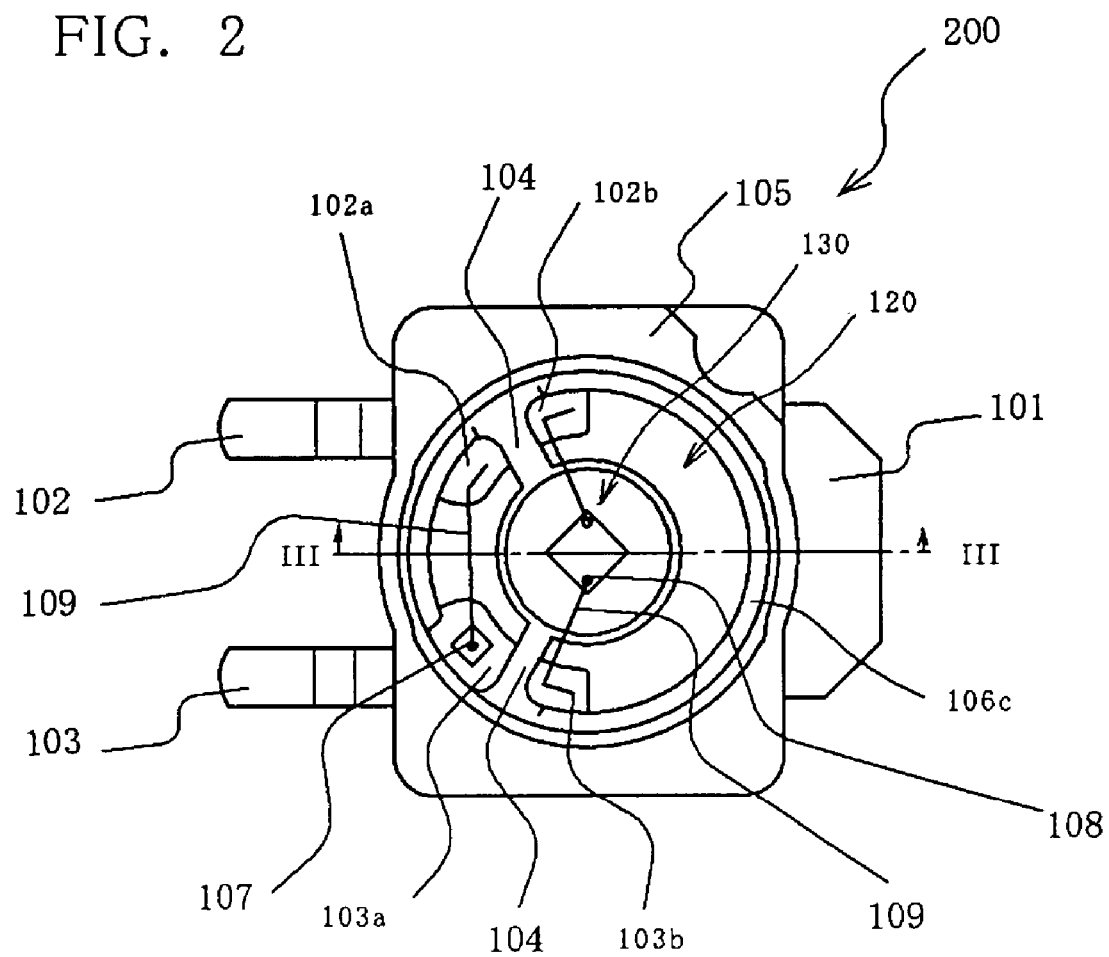
FIG. 2 is a schematic top view of a semiconductor device according to an embodiment of the present invention.
Figure 3:
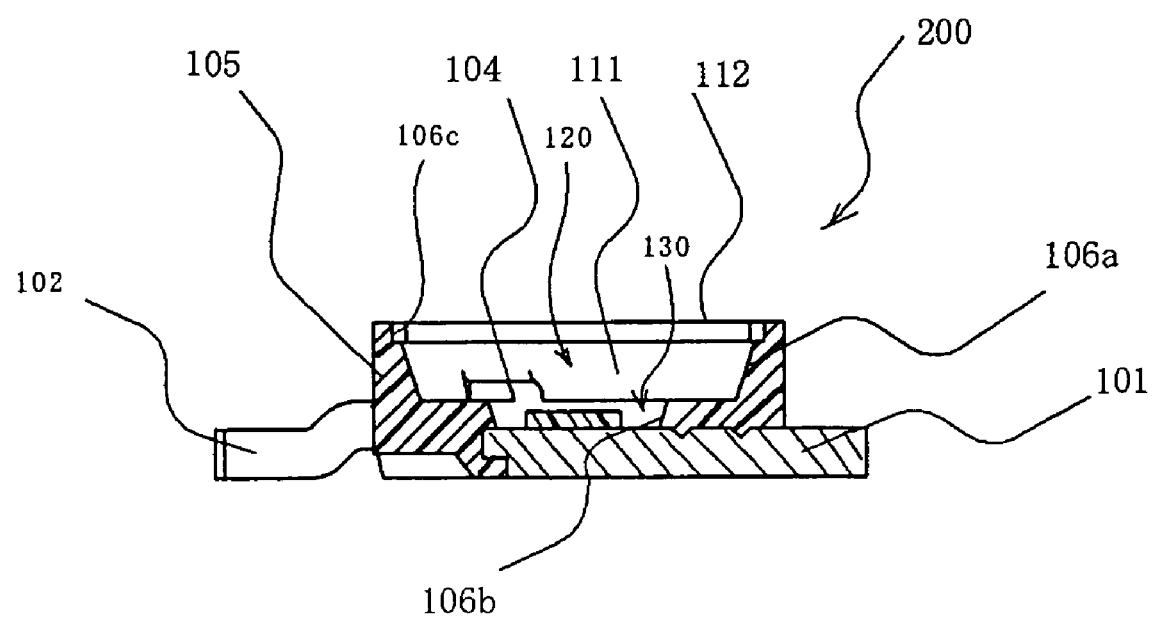
FIG. 3 is a schematic cross sectional view taken along the line III-III of a molded package according to the embodiment shown in FIG. 2 of the present invention.
Figure 4:
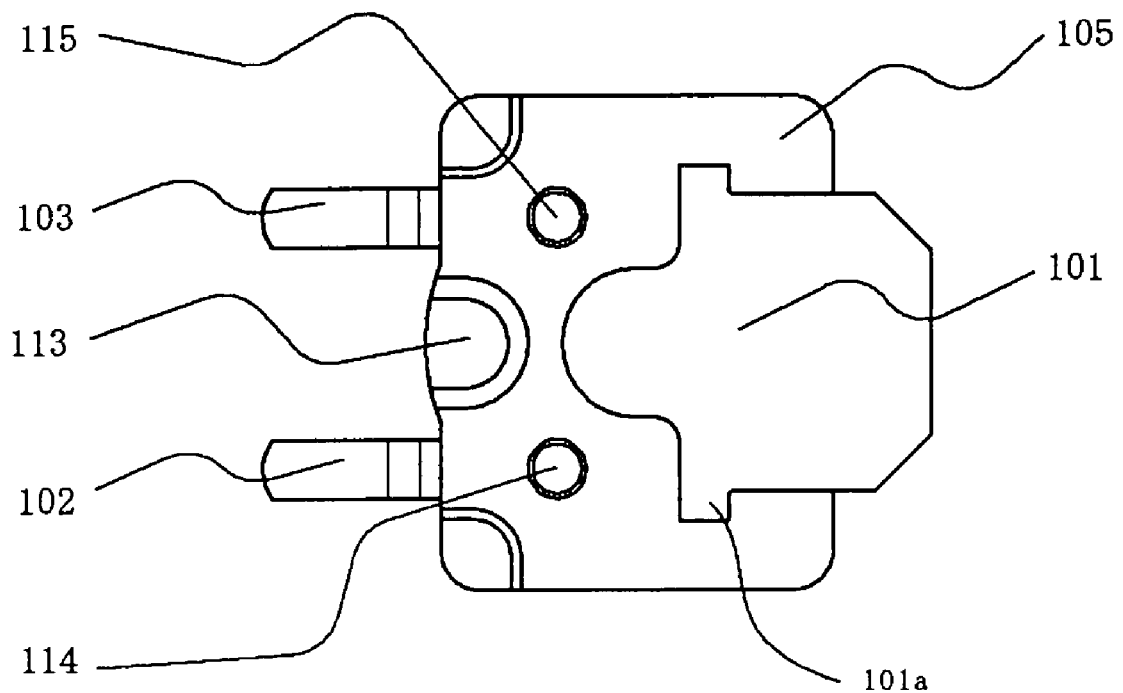
FIG. 4 is a schematic rear view of a molded package according to the embodiment shown in FIG. 2 of the present invention.

FIG. 1 shows a schematic perspective view of a molded package according to the present embodiment. FIG. 2 is a schematic top view showing the semiconductor device 200 according to the present embodiment. FIG. 3 shows a schematic cross sectional view taken along dotted line III-III of FIG. 2. FIG. 4 shows a schematic rear view of a molded package shown in FIG. 1 and FIG. 2.

That is, the molded package 100 of the present invention includes a first metal member 101 and a second metal member 102, and a third metal member 103. The metal members are oppositely disposed, and insulated from each other by the mold member 105. Here, the molded package is formed by way of integral molding so that one end of the first metal base 101, one end of the second metal base 102, and one end of the third metal base 103 are inserted in the mold member 105 and respective other ends are protruded from the outer surface of the mold member 105.

Also, a recess (first recess 120) is formed by the internal surface 106a in the main surface side of the molded package so as to house the semiconductor component. A part of the main surface of the metal members is exposed at the bottom surface of the recess. Moreover, in the first recess 120, a second recess 130 formed by the internal surface 106b is formed and the main surface of the first metal member is exposed in the bottom surface of the second recess 130.

Here, the term "main surface" in the present specification refers to each surface of the components of the semiconductor device such as the molded package, a metal member, and a lead electrode, on the same side where the semiconductor component is mounted. For instance, the emission surface side of the light emitting element is the light extraction side.

As shown in FIG. 1, it is desirable to form a step 106c in the first recess 120 near the opening. By forming such a step 106c, an encapsulating resin with a high adhesion such as flexible silicone resin can be prevented from creeping up to the top surface of the molded package. Thus, a sealing resin having high adhesion such as a flexible silicone resin can be used.

A recess may be formed on the main surface side of the first metal member 101 so that a semiconductor component such as a light emitting element can be mounted in the bottom surface of the recess. A rear face of the first metal member 101 facing the main surface is exposed from the mold member 105 as shown in FIG. 3 and FIG. 4, so as to be on the approximately same plane with the rear surface of the molded package 100 (the mounted surface of the semiconductor device). With this construction, the mountability of a semiconductor device improves and the contact area with the mounting surface increases. Therefore, the heat dissipation of the semiconductor device can be improved.

The second metal member 102 and the third metal member 103 are used as the lead electrodes for supplying electric power to the light emitting element 108 and the protective element 107 being housed in the recess formed in the main surface of the molded package 100. A part of rear surfaces of the protruded second metal member 102 and the third metal member 103 from the outer wall of the molded package 100 are bent so as to be on the approximately same plane with the rear face of the molded package 100 (rear surface of the first metal member 101), and made to the joining terminals for connecting to a conductive pattern formed on the external mount substrate.

A part of the main surfaces of the second metal member 102 and the third metal member 103 are exposed in the bottom surface of the first recess 120 of the molded package 100. Further, a part of the mold member 105 forming the inner wall of the first recess 120 extends toward the second recess 130 as the wall portion 104, and a part of the wall portion 104 extends approximately to the same plane with the inner wall 106b. Thus, the exposed main surfaces of the metal members are divided.

The divided main surfaces have a plurality of bonding regions of 102a, 102b, 103a, and 103b. That is, a region where a conductive wire used for connecting to a semiconductor component to be wire bonded, or a region where a protective element used for protecting a semiconductor component such as a light emitting element from destruction by an excess voltage to be die bonded.

Especially, the semiconductor device of the present embodiment shown in FIG. 2 includes a light emitting element 108 mounted on the bottom surface of the second recess 130 and a protective element 107 having a back electrode. The protective element 107 is mounted to one of the bonding regions facing the rear electrode via a conductive member. The conductive wires 109 connecting to the light emitting element 108 and the protective element 107 are respectively wire bonded to the different bonding regions of 102a, 102b, 103a, and 103b which are isolated by the wall portion 104.

For example, the protective element 107 is die bonded to the bonding region 103a of the third metal member 103, and the conductive wires 109 connecting to the protective element are wire bonded to the bonding region 102a of the second metal member 102. In this case, among the conductive wires 109 connecting to the light emitting element 108, the conductive wire 109 connecting to the same polarity with the bonding region 103a where the protective element 107 is die bonded, is wire bonded to the bonding region 103b which is adjacent to the bonding region 103a where the protective element 107 is die bonded and isolated by the wall portion 104.

In contrast, among the conductive wires 109 connecting to the light emitting element 108, the conductive wire connecting to the same polarity with the bonding region 102a where the conductive wire connecting to the protective element 107 is wire bonded, is wire bonded to the wire bonding region 102b adjacent to the wire bonding region and isolated by the wall portion 104. Here, a plurality of conductive wires may be used provided that they are wires bonded to the same bonding region. By this construction, electric connection can be maintained even when a wire breaks provided that other wires remain connected. Thus, a semiconductor device with a high reliability can be obtained.

The wall portion 104 of the present embodiment covers the main surfaces of the second metal member 102 and the third metal member 103, except an area necessary for bonding the conductive wires 109 and the protective element 107. Therefore, the exposed areas of the first member 101, the second member 102, and the third member 103 metal members on the bottom face of the recess can be reduced compared to the conventional art, and the first encapsulating member 111 and the second encapsulating member 112 become difficult to separate from the molded package. The wall portion 104 increases the contact area of the encapsulating member and the mold member, which have relatively high adhesion each other. Therefore, the encapsulating member becomes difficult to separate from the molded package. Moreover, the stress of the encapsulating member concentrates in the direction of the wall portion 104. Therefore, the conductive wires 109 are subjected to less stress generated from the encapsulating member so that detachment of the conductive wires 109 from the bonding areas becomes less likely to occur. As described above, a semiconductor device with high reliability can be made by using the molded package according to the present embodiment.

Embodiment 2

Figure 5:
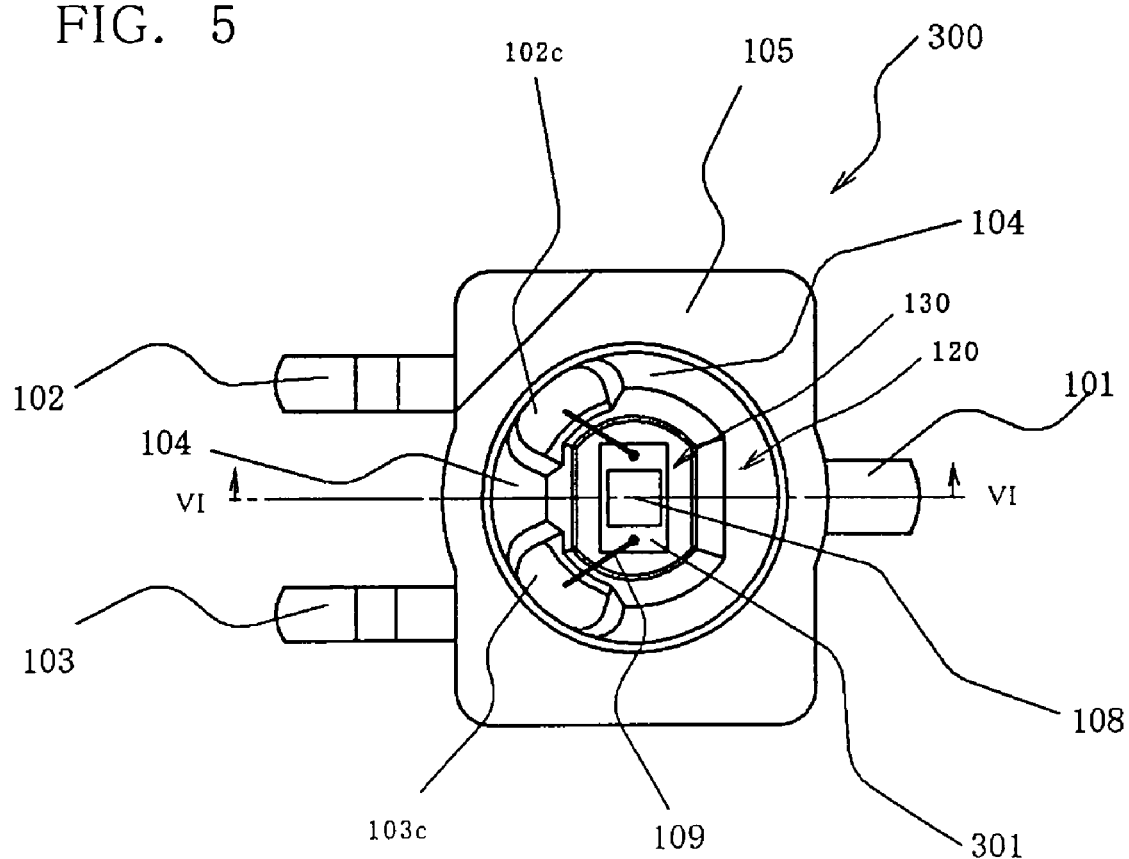
FIG. 5 is a schematic top view of a semiconductor device according to another embodiment of the present invention.
Figure 6:
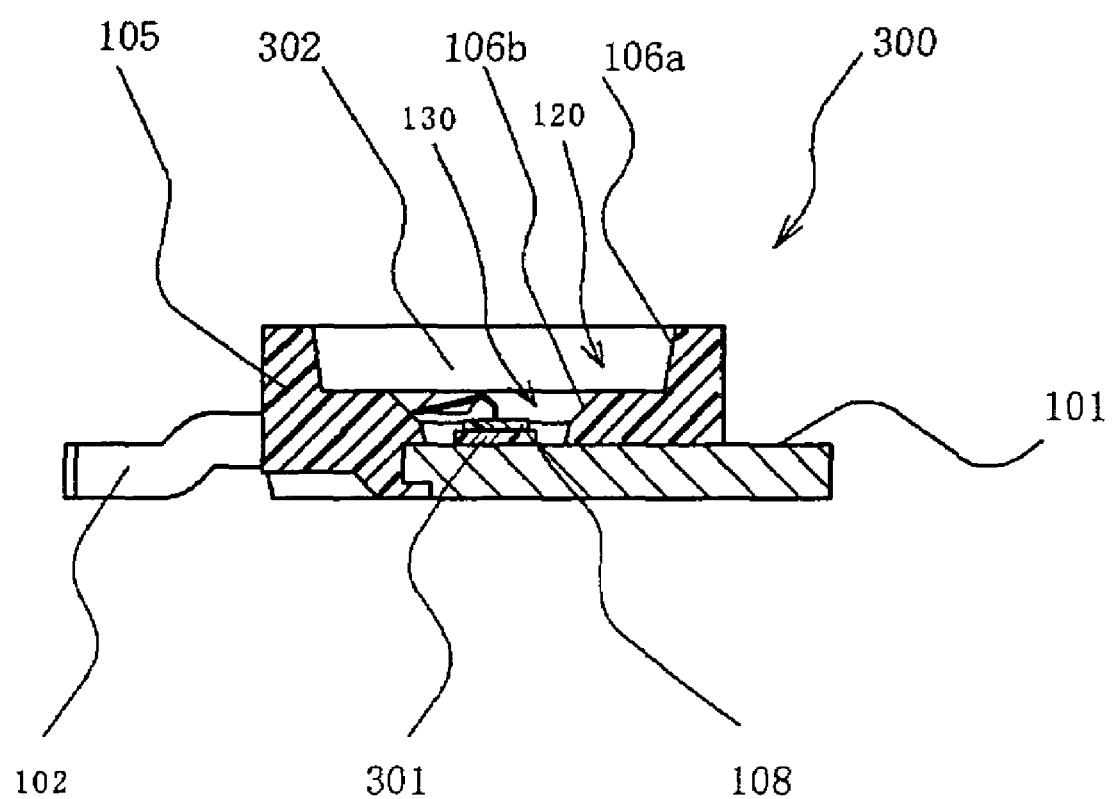
FIG. 6 is a schematic cross sectional view of a semiconductor device according to the embodiment taken along the line VI-VI in FIG. 5 of the present invention.
Figure 7:
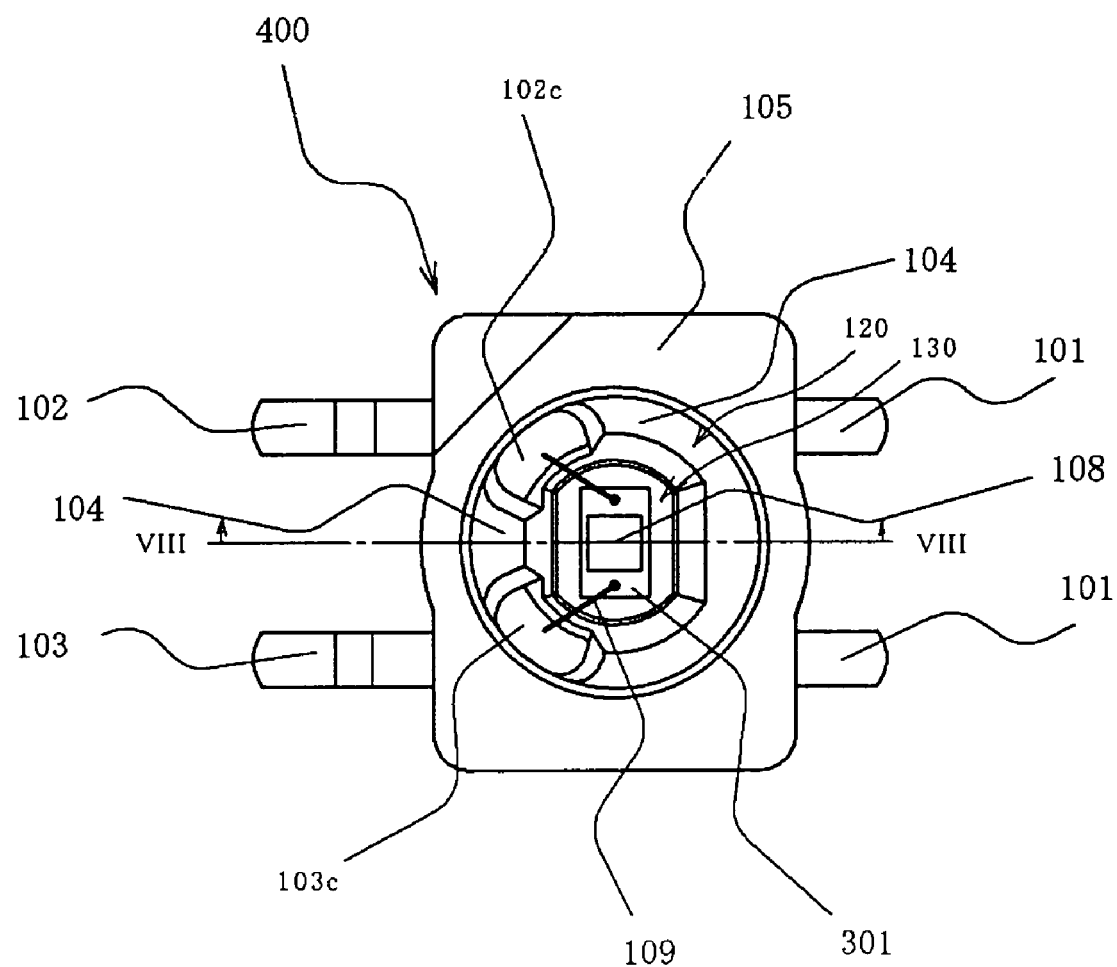
FIG. 7 is a schematic top view of a semiconductor device according to yet another embodiment of the present invention.
Figure 8:
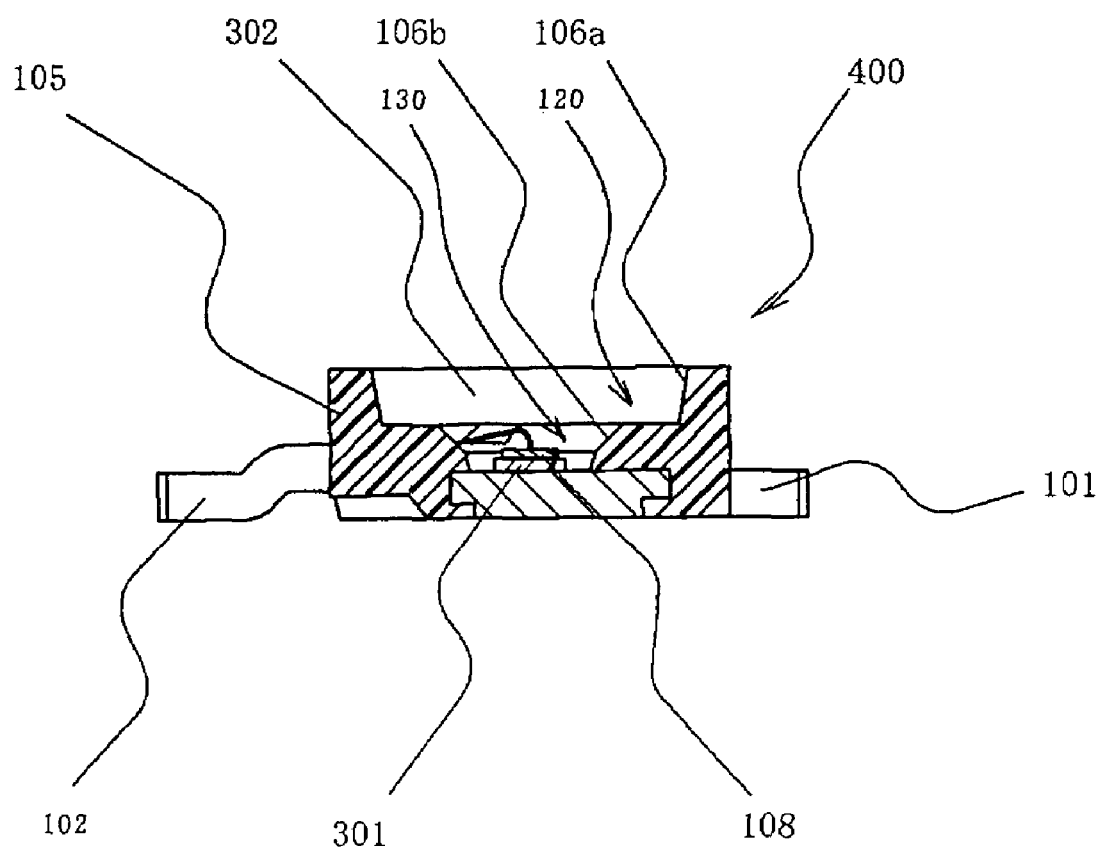
FIG. 8 is a schematic cross sectional view of a semiconductor device according to an embodiment of the present invention taken along the line VIII-VIII in FIG. 7.
Figure 9:
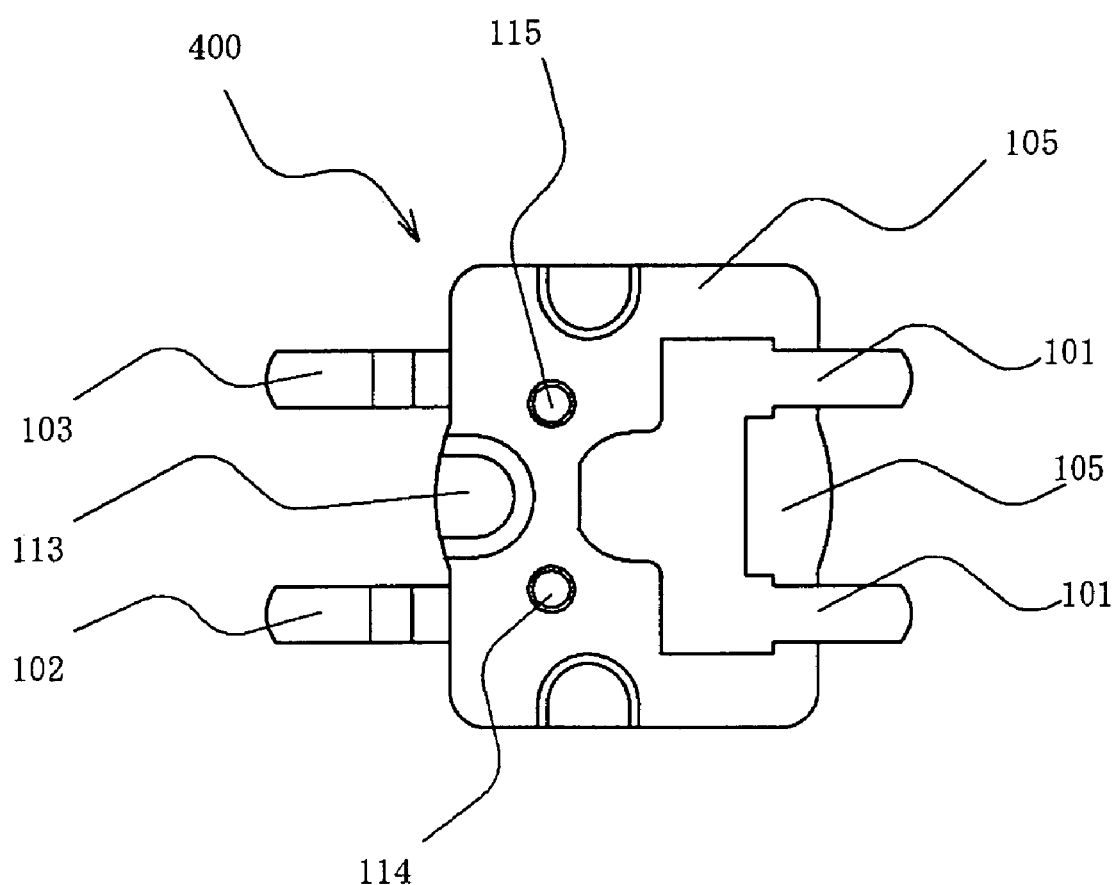
FIG. 9 is a schematic rear view of a semiconductor device according to the embodiment of the present invention shown in FIG. 7.
Figure 10:
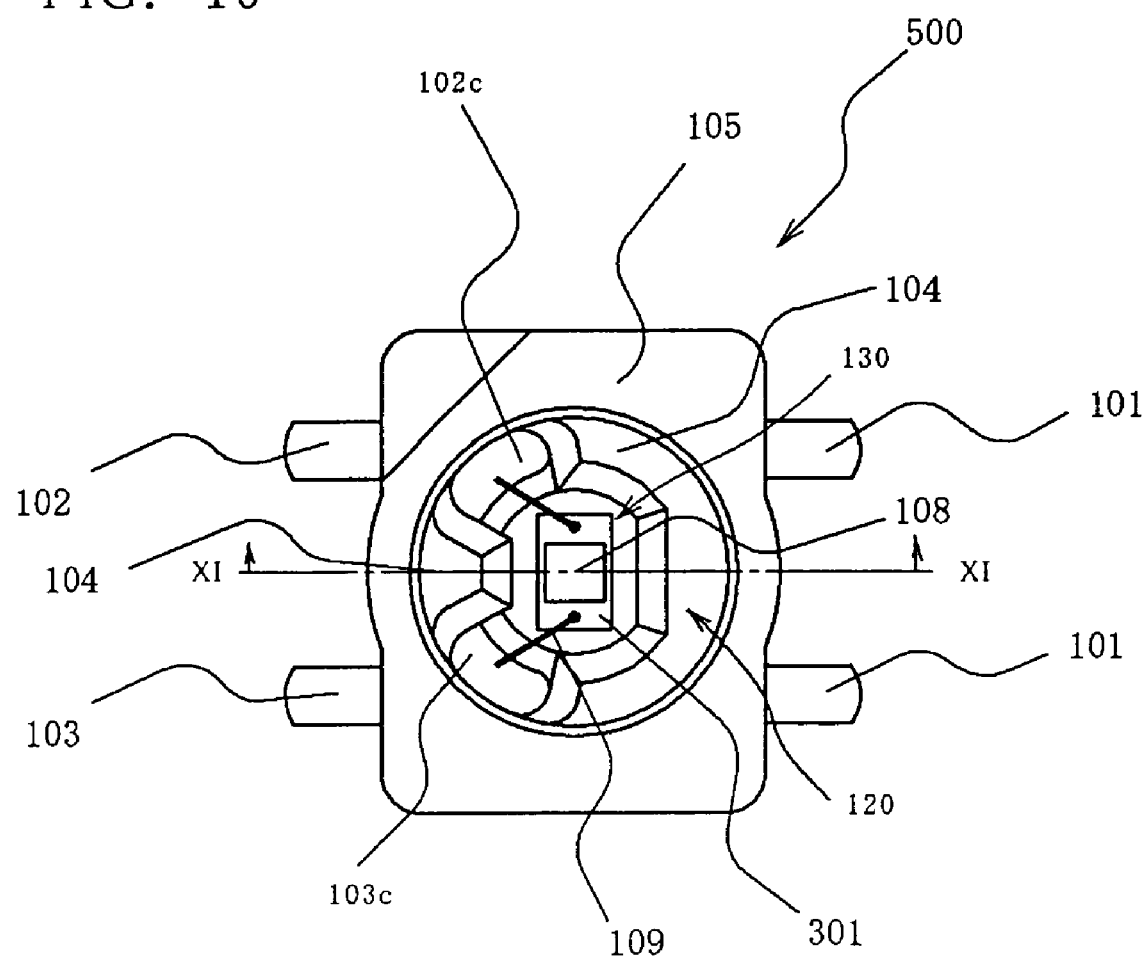
FIG. 10 is a schematic top view of a semiconductor device according to yet another embodiment of the present invention.
Figure 11:
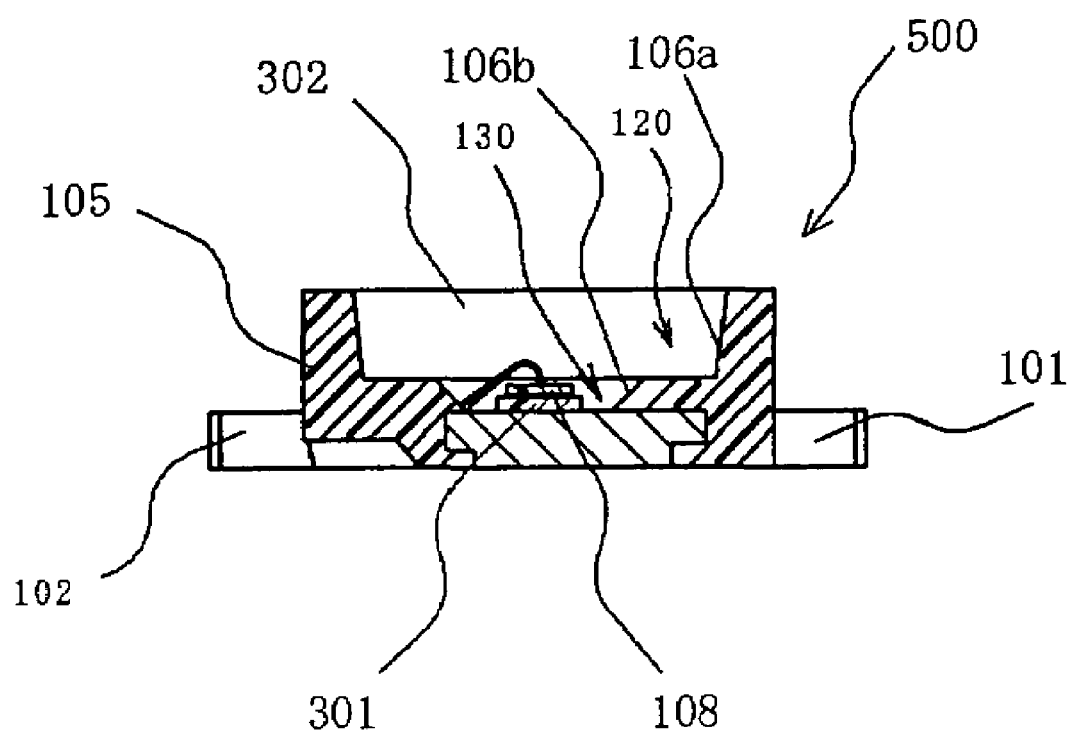
FIG. 11 is a schematic cross sectional view taken along the line XI-XI in FIG. 10 of a semiconductor device according to the embodiment of the present invention.

FIG. 5 shows a schematic top view of a semiconductor device 300 of the present embodiment, and FIG. 6 shows a schematic cross sectional view taken along dotted line VI-VI of FIG. 5. FIG. 7 shows a schematic top view of a semiconductor device of another embodiment, and the FIG. 8 shows a schematic cross sectional view taken along dotted line VIII-VIII of FIG. 7. FIG. 9 shows a rear view of the semiconductor device shown in FIG. 7. FIG. 10 shows a schematic top view of a semiconductor device of yet another embodiment, and FIG. 11 shows a schematic cross sectional view taken along dotted line XI-XI of FIG. 10.

A molded package according to the present embodiment includes a first metal member 101, a second metal member 102, a third metal member 103 and an encapsulating member 302. The metal members are oppositely disposed, and insulated from each other by the mold member 105, as described in the embodiment above. Here, the first metal member 101, the second metal member 102, and the third metal member 103 are formed with a mold member by way of integral molding.

The first metal member 101 is protruded from the outer wall of the opposite side from the second metal member 102 and the third metal member 103. Also, a first recess 120 is formed by the inner surface 106a in the molded package 100 on the main surface side, and a part of the main surface of each metal member is exposed from the bottom surface of the recess.

Further, a second recess 130 made of the inner surface 106b is formed in the first recess 120, and the main surface of the first metal base is exposed from the bottom surface of the second recess 130. A semiconductor device is disposed on the exposed main surface of the first metal member. Especially, the molded package according to the present embodiment includes a third recess where a portion of the second metal member 102 and the third metal member 103 are exposed, and the bottom face of the third recess is formed between the bottom face of the first recess 120 and the bottom face of the second recess 130.

Further, the molded package according to the present embodiment includes the bonding areas 102c and 103c formed by exposing the second metal member 102 and the third metal member 103 from the bottom face of the third recess. Here, the bonding areas 102c and 103c are isolated in the first recess 120 by a wall portion 104 made of a part of the mold member.

The wall portion 104 of the present embodiment is formed around the bonding areas 102c and 103c except for a necessary area for bonding the conductive wires, and covers the main surfaces of the second metal member 102 and the third metal member 103. Consequently, the area of the exposed metal member at the bottom surface of the recess can be reduced compared to the conventional art, and it becomes difficult to detach the encapsulating member from the molded package. Further, the stress from the encapsulating member tends to concentrate in the direction of the wall portion 104.

Thus, the conductive wires are less subject to the stress exerted from the encapsulating member, and the conductive wires are not easily detached from their bonding area. Thus, a semiconductor device according to the present embodiment can be formed with a high reliability. Each component of the present invention will be described in detail below with reference to the accompanying drawings.

[Molded Package 100]

An example of the construction of the molded package 100 is shown in FIG. 1 and FIG. 2. The second metal member 102 is the positive electrode, the third metal member 103 is the negative electrode, and the first metal member 101 is a heat sink where a semiconductor component is mounted and functions as a heat sink. These elements are inserted in the mold member 105 and insulated from each other.

The mold is plugged by inserting the tip portions of the lead frame which is the material of the metal members, with the tips facing each other. Then, a molding resin is injected in the mold from a gate and heat is applied to cure the resin. Thus, the molded package is formed. Also, the molded package 100 includes a wall portion 104 in the first recess 120. The wall portion 104 is made of the same mold member as the molded package 100.

The wall portion 104 is formed on the main surfaces of the second metal member 102 and the third metal member 103 so as to extend in the direction from a part of the inner surface 106a of the first recess 120 to the second recess 130. The shape of the wall portion 104 is not specifically limited, and any shapes may be used, provided that the wall portion exposes at least two bonding regions on the main surface. Such a shape can be formed simultaneously with the molded package, by making the mold of the molded package 100 capable of forming a desired shape of the wall portion. Moreover, the height of the wall portion 104 from the main surfaces (bonding regions) of the second metal member 102 or the third metal member 103 is preferably larger than the thickness of the metal piece formed by wire bonding of the conductive wires 109.

With this construction, the stress from the encapsulating member 111 and 112 covering the semiconductor component concentrates on the wall portion 104. Therefore, the stress concentration of the conductive wires in the direction of the metal piece can be avoided and the detachment of the conductive wires can be prevented.

In detail, the first recess 120 made by the inner surface 106a is formed on the main surface side of the molded package 100 and at least three metal members 101, 102, and 103 are inserted in the molded package 100 from one side of the outer surface, and the main surfaces of the metal members are exposed from the bottom surface of the first recess 120. Here, the third recess capable of housing the light emitting element 108 is preferably formed in the main surface of the first metal member 101. At the same time, a step may be formed in the mold member outside of the opening of the second recess 130, and the first main surface expanding outwardly on the top surface of the side surface of the second recess 130 and a second main surface expanding outwardly over the first main surface may be formed.

The second metal member 102 and the third metal member 103 are inserted in the molded package 100 from the opposite side of the first metal member. The main surfaces of the second metal member and the third metal member are exposed as a pair of lead electrodes from the bottom of the first recess 120.

The main surface of the lead electrode is separated into at least two regions by the wall portion made of the mold member and exposed as the bonding regions. Moreover, in each bonding region, the light emitting element 108 or the protective element 107 is mounted, or the conductive wires each connected to the respective electrodes of the light emitting element 108 or the protective element 107 are connected to each bonding region. Further, the step formed between the first main surface and the second main surface described above, and the third recess formed on the first metal member facilitate the positioning of a resin including a fluorescent material around the light emitting element.

The semiconductor device of the present invention is obtained by using the package having such a construction where the light emitting element 108 is mounted in the recess and enclosed by a first encapsulating member 111 which is a flexible member and a second encapsulating member which is a rigid member.

The molded package according to the present embodiment may include a step 106c in the vicinity of the opening of the first recess 120. The step 106c can prevent the flexible resin from creeping out from the opening. Therefore, a flexible member with high adhesion can be used for the first encapsulating member so that the semiconductor device can be made with a high reliability.

Here, the main surface of the lead electrode exposed from the first recess 120 is only required to provide a necessary exposed area for fixing the conductive wires which cross link to respective electrodes of the light emitting element 108 or the protective element 107. Other main surfaces of the lead electrodes are preferably covered by the same material as the molding resin used for the package. This can avoid the occurrence of expansion caused by the evaporation at the interface between the lead electrode and the first encapsulating member.

In addition, the contact area between the package molding resin and the encapsulating member, which has relatively strong adhesion, can be widened by exposing the necessary area for fixing the light emitting element 108 or the protective element 107 and the conductive wires and forming the wall portion described above. With this construction, the integrity of the semiconductor device can be improved and detachment of the sealing member can be prevented. As a result, the light emitting device with excellent optical properties and high reliability can be obtained.

Here, the molded package of the present embodiment may have a step 106c in the vicinity of the opening of the first recess 120. By forming a step 106c, the flexible member can be prevented from creeping out from the opening. Therefore, a flexible member having a high adhesion can be used for the first encapsulating member and the semiconductor device having high reliability can be obtained.

(Lead Electrode)

In the present embodiment, a lead electrode is a conductive material supplying electric power to the semiconductor component, which is provided as one of the metal members and a structural element of a molded package in the same way as the metal member whereon the semiconductor component is mounted. The lead electrode of the present embodiment is formed as a portion of the lead frame made by punching a metal plate, and inserted into the mold. Then, integral molding is carried out to form the molded package.

The lead electrode can be formed using a high conduction material such as copper or copper including iron. In addition, when a light emitting element is used as the semiconductor component, a metal plating using such as silver, aluminum, copper or gold may be performed on the surface of the lead electrode in order to improve the reflectance of the emission from the light emitting element and preventing oxidation of the lead material. Also, it is preferable to make the surface of the lead electrode smooth to improve the reflectance. Further, the area of the lead electrode is preferably increased according to the size of the molded package. By this arrangement, the heat dissipation can be improved and a temperature rise in the semiconductor component can be effectively prevented.

Consequently, relatively large power can be applied to the light emitting element so that optical output can be increased.

The lead electrode is formed, for example, as a part of the lead frame by punching a long metal plate made of a copper alloy with a thickness of 0.15 mm, using a press machine. In the present embodiment, the pairs of the positive and negative lead electrodes are placed in a row and the first metal members are placed in a row facing the positive and the negative lead electrodes, then, a press working is performed.

In the light emitting device of the present invention, it is preferable that the corner made by the rear surface and the side surface of a lead electrode be rounded. When the end of the lead electrode is rounded according to the direction of the resin injection as described above, the molding resin flows smoothly. As a result, the adhesion between the lead electrodes and the molding resin can be improved.

Moreover, the resin can be filled in the gap of a pair of the lead electrodes exposed from the bottom surface of the first recess 120 without leaving a space, and the shape of the line of contact between the molded resin and a lead electrode corresponds to the shape of the lead electrode. The joint line of the side surface and the rear surface of the mold member can be made to a recess shape with a rounded base angle. Thus, stress concentration on the joint line can be avoided and occurrence of package cracks can be prevented.

Moreover, in the cross-sectional shape that vertically cuts the lead electrode from the main surface side into the rear side, it is desirable that the corner formed by the main surface and the side surface of the lead electrode has an acute angle. As a result, adhesion between the lead electrode and the first mold member is improved, and detachment at the interface can be prevented.

In addition, the outer lead portion of the positive and negative lead electrodes protruding from the outer wall of the molded package are formed as a gull-wing shape, so that the rear faces of the outer lead portion, mold resin and metal member are placed on the same plane. Thus, the positive and negative joining terminals are formed. In addition, the structure of the contact terminal portion according to the present invention is not limited to a gull-wing type and it may be made to have other structures such as a J-bend type.

(Metal Member)

The metal member in the present embodiment is a metal member used as the lead electrode as described above, or a metal material used as the first metal member 101 where the third recess is formed in the center for housing the semiconductor component and capable of effectively releasing heat generated from the semiconductor component. Such metal member is formed in a part of the lead frame in the same way as the lead electrode, inserted in the mold member, and integrally molded to form the molded package.

The metal member has a region for mounting the light emitting element 108 on the main face side, and the rear surface is approximately coplanar with the mounting surface of the semiconductor device. In other words, the rear surface of the joining terminal portion of the lead electrodes and the rear surface of the mold member, being in alignment such that both surfaces come in contact with the other mounting substrates. By this construction, heat from the light emitting element 108 can be directly released to the mounting substrate. As a result, the current supply to the light emitting element 108 can be increased and the light output can be improved.

The thickness of the bottom of the recess formed in the region where the light emitting element 108 or the protective element 107 to be mounted is made thin so as to have good heat dissipation. It is desirable to form the recess in the center of the semiconductor device, because good directional characteristics can be obtained when the semiconductor device is a light emitting device. In addition, it is desirable to form the recess with a volume for housing the entire portion of the light emitting element. As a result, light emitted from the four side faces of the light emitting element can be excellently extracted in the direction of the top surface by the inner wall of the recess. Moreover, when a portion of the light from the light emitting element is absorbed by a wavelength conversion member in order to convert the light into a light having a different wavelength, the entire light emitting element disposed in the recess can easily be covered with the wavelength conversion member.

The wavelength conversion member comprises a transparent member and a fluorescent material which absorbs a portion of light emitted from the light emitting element and is capable of emitting light having a different wavelength.

The package used in the present invention has excellent heat dissipation especially at the recess where the light emitting element is mounted. Therefore, a material for the wavelength conversion member is not limited to an inorganic material, and an organic material can be used. Also, deterioration of the organic material caused by a large current loading does not really occurs in the package of the present invention, so that excellent optical characteristics can be obtained. Moreover, it is desirable to form the inner wall of the recess as a tapered wall which the volume gradually increases toward the opening. By this, the light emitting device capable of emitting light with further high luminance can be obtained.

The third recess is formed, for example, by performing a pressing or creeping treatment on a metal plate. In the present embodiment, creeping is applied from the main surface direction of a metal plate, and a recess portion is made while moving the metal in the direction of the rear face. As a result, the outline of the rear face has a recess and a protrusion and the contact area with the molded resin portion increases. Thus, structural integrity can be strengthened.

The thermal conductivity of lead electrode and the metal member are preferably in the range between 10 W/m·K to 100 W/m·K inclusive, more preferably between 15 W/m·K to 80 W/m·K inclusive, further preferably between 15 W/m·K to 50 W/m·K inclusive. With this arrangement, the light emitting device capable of enduring a large current for a long time while maintaining reliability can be obtained.

[Semiconductor Component]

The semiconductor component according to the present invention may comprise a combination of at least one kind of a light emitting element, a photodetector, and a protective element which protects the semiconductor components from destruction caused by overvoltage. A protective element without having a semiconductor structure also exists besides a protective element having a semiconductor structure. In a protective element having a semiconductor structure, the direction of electric current becomes important. Therefore, the protective element is described as a semiconductor element for the sake of simplicity. However, a protective element without having a semiconductor structure can be also used. Especially, in the present embodiment, the light emitting element which is housed in the molded package in combination with the protective element and made to a semiconductor device, is described.

(Light Emitting Element)

The light emitting element chip used in the present invention is not specifically limited. In the case as described above, a pair of lead electrodes and a metal base are insert-molded with a mold member and a light emitting element chip having a pair of positive and negative electrodes in the same plane side are used. Moreover, when a fluorescent material is used, it is preferable to use a semiconductor light emitting element having a light emitting layer capable of emitting light with a wavelength which is capable of exciting the fluorescent material. Examples of such semiconductor light emitting elements comprise various semiconductors such as ZnSe and GaN. However, a nitride semiconductor ($In_XAl_YGa_{1-X-Y}N$, $0 \leq X$, $0 \leq Y$, $X+Y \leq 1$) capable of emitting light with a short-wavelength which sufficiently excites the fluorescent material is preferable. Moreover, boron or phosphorus can be included in the nitride semiconductor if needed.

The structure of the semiconductor may be homostructure, heterostructure, or double heterostructure which have MIS junction, PIN junction, or p-n junction. Various wavelengths of emission can be selected according to the materials and the mixed crystal ratio of the semiconductor layer. Also, the active layer can be of a single well structure or a multiple well structure, formed as a thin layer wherein a quantum effect can occur. In the case where a nitride semiconductor is used, a material such as sapphire, spinel, SiC, Si, ZnO, or GaN is preferably used as the semiconductor substrate. It is preferable to use a sapphire substrate in order to form a nitride semiconductor having good crystallinity and which can be efficiently produced in quantity.

A nitride semiconductor can be formed on the sapphire substrate using the MOCVD method or the like. A buffer layer made of such as GaN, AlN, GaAlN is formed on the sapphire substrate and a nitride semiconductor having a p-n junction is formed thereon.

Examples of light emitting elements having a p-n junction using a nitride semiconductor include a double hetero structure wherein a first contact layer of the n-type gallium nitride, a first cladding layer of the n-type aluminum gallium nitride, an active layer of indium gallium nitride, a second cladding layer of the p-type aluminum gallium nitride, and a second contact layer of the p-type gallium nitride, are layered on the buffer layer in sequence.

Nitride semiconductors show n-type conductivity under the condition where no impurities have been doped. In order to form an n-type nitride semiconductor having the desired properties such as improved light emission efficiency, it is preferable to arbitrarily introduce an n-type dopant such as Si, Ge, Se, Te, and C. On the other hand, in order to form a p-type nitride semiconductor, it is preferable to dope with a p-type dopant such as Zn, Mg, Be, Ca, Sr, and Ba. Due to the fact that a nitride semiconductor is not easily converted to the p-type solely by doping a p-type dopant, it is preferable to lower its resistance by heating in a furnace, or plasma irradiation and the like after the p-type dopant is introduced. The substrate of the semiconductor can be removed after forming a metal layer on the p-type layer. When the light emitting element having such a construction is mounted with the metal layer being on the mounting face-side, a light emitting device with high heat dissipation can be obtained.

After respectively forming each electrode on the exposed portions of the p-type layer and the n-type layer, the semiconductor wafer is cut into chips. Thus, a light emitting element made of a nitride semiconductor can be formed.

In order to emit white light using the light emitting diode of the present invention, the wavelength of light emitted by the light emitting element is preferably from 365 nm to 530 nm inclusive, and more preferably from 420 nm to 490 nm inclusive, in consideration of, for example, the complementary color relationship with the luminance wavelength of the fluorescent material and deterioration of the transparent resin. It is furthermore preferable that the wavelength of light emitted by the light emitting element is from 450 nm to 475 nm inclusive, in order to improve the excitation and the emission efficiency of the light emitting element and the fluorescent material.

In addition, in the present invention, the light emitting element chip is reliably enclosed with the first encapsulating member having excellent light stability and flexibility, so that local deterioration of components caused by near-ultraviolet or ultraviolet radiation can be prevented. Therefore, a color-converting light emitting device with little irregular color can be obtained according to the present invention by using the light emitting element having a main wavelength in the ultraviolet region of shorter than 400 nm in combination with a fluorescent material which absorbs a portion of light emitted from the light emitting element and capable of emitting light having a different wavelength thereof. When the fluorescent material is bound to the light emitting element, it is desirable to use a material such as a resin having a relatively high ultraviolet resistance or a glass which is an inorganic substance.

Here, the light emitting element is, for example, a gallium nitride compound semiconductor element capable of emitting blue light. The light emitting element is formed in such way, for example, a nitride semiconductor layer comprising an n-type layer, an active layer, and a p-type layer is formed on a sapphire substrate, and subsequently, the n-electrode is formed on the exposed portion of the n-type layer which is made by removing a portion of the active layer and a portion of the p-type layer, then, the p-electrode is formed on the p-type layer.

(Protective Element)

The protective element of the present embodiment is an semiconductor element housed in the first recess 120 of the molded package with other semiconductor components such as a light emitting element in order to protect other semiconductor components from destruction caused by excessive voltage. Besides the protective element having a semiconductor structure, a protective element without having a semiconductor structure is also used. Specific examples of the protective element applicable in the present embodiment include a Zenner diode which becomes conductive when a voltage larger than the stipulated voltage is applied, and a condenser which absorbs pulse voltage.

The protective element capable of functioning as a Zenner diode includes a p-type semiconductor region having a positive electrode and an n-type semiconductor region having a negative electrode. The negative and the positive electrodes of the protective element are connected back-to-back to the p-side electrode and n-electrode of the light emitting element respectively. As described above, when an excessive electric voltage is applied to the area between the positive and the negative electrodes and it surpasses the Zenner voltage, the area between the positive and the negative electrodes of the light emitting element is maintained at the Zenner voltage, and is prevented from exceeding the Zenner voltage. Thus, an excess loading of voltage between the light emitting elements can be prevented. Therefore, the light emitting elements can be protected from excess voltage and the potential destruction of the element and its performance degradation can be prevented.

A chip member for surface mounting can be used for the condenser as a protection element. Strip electrodes are disposed on both sides of the condenser having such a structure and each electrode is respectively connected to the positive and the negative electrodes of the light emitting element with a parallel connection. When an excess voltage is applied to a pair of positive and negative electrodes, a charging current is induced and it flows into the condenser, which leads the terminal voltage of the condenser to drop instantaneously. Thus, the voltage applied to the light emitting element is prevented from rising, so that the light emitting element can be protected from an excess voltage. Moreover, when a noise which includes a high frequency component is applied, the condenser functions as a bypass condenser. Therefore, the noise can be eliminated.

As shown in FIGS. 5 to 11, a composite component may be used as the semiconductor element to be mounted on the package. A composite component is formed by joining a pair of positive and negative electrodes of the light emitting element 108 via bumps with a pair of positive and negative electrodes formed on the submount 301 so as to face each other. On the surface of the submount 301, a positive electrode and a negative electrode of a conductive material are disposed on the same face side, and insulated from each other. For the conductive member, it is preferable to use a metal having silver white color, especially a metal having a high reflectivity, such as aluminum, silver, gold, or an alloy thereof.

It is preferable to use silicone for the submount 301. This is because silicon is capable of forming a protective element which prevents light emitting element 108 from destruction caused by an excessive voltage. Also, a material having approximately the same thermal expansion coefficient with the nitride semiconductor light emitting element, for example, aluminum nitride is desirable for the submount 301. By using such a material, thermal stress between the submount 301 and the light emitting element 108 can be reduced and electrical connection via bumps can be maintained without causing separation between the submount 301 and the light emitting element 108, so that reliability of the light emitting device can be improved.

Here, if the light emitting element 108 and the protective element are respectively die-bonded to the package or the like, and connected to the lead electrodes by the conductive wires 109, the number of bonds with the conductive wires increases. As a result, productivity decreases. In addition, occurrence of contact and disconnection among the conductive wires increases, which causes a decrease in the reliability of the semiconductor device. On the other hand, in a composite component made by integrating the light emitting element 108 and the protective element, the conductive wires 109 only has to be connected to the positive and negative electrodes formed on the submount 301, and the conductive wires 109 are not needed to be directly bonded to the light emitting element 108. Therefore, the light emitting device with a high reliability can be obtained without having such problems described above.

To improve the reliability of the light emitting device, an underfill may be applied to fill the gap that occurs between the light emitting element 108 and the submount 301 which are facing each other. The material of the underfill is, for instance, a thermosetting resin such as epoxy resin. Moreover, in order to ease the thermal stress of the underfill, aluminum nitride, aluminum oxide, and complex mixtures thereof, etc. may be mixed into an epoxy resin. The amount of underfill is an amount sufficient to fill the gap that occurs between the positive and the negative electrodes and the submount of the light emitting element.

The p-side electrode and the n-side electrode of the light emitting element 108 are fixed so as to face the positive and the negative electrodes of the submount 301 respectively. First, bumps made of Au are formed corresponding to the positive and the negative electrodes of the submount 301.

Next, the electrodes of the light emitting element 108 and the submount 301 are placed opposite each other via bumps. The bumps are then welded by applying load, heat, and ultrasound. Thus, the electrodes of the light emitting element 108 and the submount 301 are connected. In addition, an eutectic solder such as (Au—Sn), Pb—Sn, and a lead free solder can be used other than Au as the material for the bump.

Further, the submount 301 is fixed on the first base member exposed from the bottom face of the second recess 130 by a Ag paste used an adhesive, and the lead electrodes exposed in the recess are connected to the positive and the negative electrodes of the submount by the conductive wires 109. Thus, the semiconductor device is formed.

[Encapsulating Member 111, 112]

The encapsulating member in the present embodiment is a member enclosing the semiconductor components housed in the molded package. For example, a transparent resin such as a flexible silicon resin or an epoxy resin can be used singly as a encapsulating member. Also, a first encapsulating member 111 which covers the light emitting element 108 and a second encapsulating member 112 which covers the first encapsulating member can be employed. Further, a semiconductor device having high reliability can be obtained by using a flexible member as the first encapsulating member and a rigid member as the second encapsulating member. A fluorescent material, a diffusing agent, and a filler can be included in an encapsulating member.

(Flexible Member)

A flexible member can be applied from the interior portion of the first recess 120 to the lower portion of the rigid member above the recess in the molded package, so as to enclose the semiconductor components mounted on the molded package. The flexible member is capable of protecting the semiconductor components from moisture and the like. The flexible member also has a transparency so that light from the light emitting element can be extracted to the outside effectively. Moreover, the flexible member has a high stability against heat, so that thermal stress generated by driving the light emitting device can be reduced. In addition, when the light emitting element of near-ultraviolet region or ultraviolet region is employed, it is desirable to use a flexible member having an excellent light stability against such light wavelengths.

Specific examples of such a flexible member are a rubber-like flexible resin, a gel silicon resin and the like. Low crosslink density or absence of a bridge structure in such a resin contributes to its excellent flexibility. Moreover, a coloring die or a color pigment can be added in order to provide a specific screen effect against the light emitted from the light emitting element chip.

(Rigid Member)

In the light emitting device according to the present invention, a flexible member disposed around the light emitting element is encapsulated with a rigid member. The rigid member used in the present invention is not limited, except for having a mechanical strength and transparency.

In the present embodiment, the rigid member which is the window portion for extracting light is located above the light emitting element 108 disposed in the first recess 120 of the molded package. The inner portion formed by the crossline of the extension of inner wall of the first recess 120 and the top surface of the rigid portion becomes the luminescent plane which involves the emission of the semiconductor device.

Light emitted from the end portion of the light emitting element is reflected and scattered in the flexible member and transmits through the rigid member, and is extracted from the front face direction. The existence range of the reflected light and the scattered light is thought to be the inner region of the extension of the inner surface of the first recess 120. Consequently, the light emitting device capable of emitting light with a desired luminescence can be obtained by adjusting the shape of the inner portion of the crossline described above to any desirable shape.

The material for the rigid member preferably has a coefficient of thermal expansion similar to that of the mold member which forms the package and the flexible member which is used in the lower portion thereof. For example, when a gel silicon resin is used as the flexible member, it is desirable to use a rigid silicon resin as the rigid member. With this construction, dust can be prevented from adhering to the gel silicon resin and an adverse effect to the optical characteristics of the semiconductor device can be prevented.

It is preferable to shape the rigid member to have a continuous back surface. By this construction, the rigid member can be disposed with a high reliability free from bubbles in the interface with the flexible member. On the other hand, the main surface side can have a curved surface with a protuberant center within the extension of the side face of the recess. By this construction, light diffused on the back face side can be efficiently converged in the direction of the front face, so that the luminous intensity in the direction of the front face can be improved.

In the present invention, the rigid member is disposed on the second main surface so as to be coplanar with its outline, and integrated structurally with the flexible member. A coloring dye and a color pigment can be added to an interior, the main surface, and the rear surface of such rigid member so as to equip a specific filter effect etc. for the light emitted from the light emitting element chip.

(Fluorescent Material)

In the present invention, a material such as a fluorescent material can be included in the flexible member and the rigid member so as to form a wavelength conversion member. Here, the fluorescent material used in the present embodiment will be described in detail.

The fluorescent material used in the present invention is a material which absorbs a portion of visible light or ultraviolet light emitted from the light emitting element and capable of emitting light having a wavelength different from the absorbed light. Moreover, the fluorescent material used in the present invention is at least excited by the light emitted from the light emitting layer of the light emitting element and capable of emitting light which has a converted wavelength, and included in the wavelength conversion member with a bonding material which fixes the fluorescent material.

In the present embodiment, a phosphor excited by an ultraviolet light and emits light having a pre-determined color can be used. Specific examples of such phosphors comprise
(1) $Ca_{10}(PO_4)_6FCL:Sb, Mn$
(2) $M_5(PO_4)_3Cl:Eu$ (wherein M is at least one selected from Sr, Ca, Ba, and Mg)
(3) $BaMg_2Al_{16}O_{27}: Eu$
(4) $BaMg_2Al_{16}O_{27}:Eu, Mn$
(5) $3.5MgO·_{0.5}MgF_2·GeO_2:Mn$
(6) $Y_2O_2S:Eu$
(7) $Mg_6As_2O_{11}:Mn$
(8) $Sr_4Al_{14}O_{25}:Eu$
(9) $(Zn, Cd)S:Cu$
(10) $SrAl_2O_4:Eu$
(11) $Ca_{10}(PO_4)_6ClBr:Mn,Eu$
(12) $Zn_2GeO_4:Mn$
(13) $Gd_2O_2S:Eu$, and
(14) $La_2O_2S:Eu$.

These phosphors may be used singly or in a mixture in the wavelength conversion member consisting of one layer. Moreover, the phosphors may be used singly or in a mixture in the wavelength conversion member comprising a multi-layer structure of at least two layers.

When the light emitted from the light emitting element and the light emitted from the phosphor are complimentary colors and the like, a mixed light in a white range can be emitted. Specific examples are cases such as the light from the light emitting element and the light from the phosphor are of three primary colors respectively, or blue light emitted from the light emitting element and yellow light from the phosphor excited thereby.

A desired white tone such as an incandescent color can be obtained in the luminescent color of the light emitting device. This is realized by variously adjusting the ratio of the phosphor and an inorganic member such as various resins and glass as an adhesive of the phosphor, the settling time of the phosphor, the shape of the phosphor, and selecting the emission wavelength of the LED chip. It is preferable that light from the LED chip and the phosphor effectively transmit through the mold member to outside of the light emitting device.

Specific examples of the phosphor include zinc cadmium sulfide activated with copper and yttrium-aluminum-garnet fluorescent substance activated with cerium (hereinafter referred to as "YAG phosphor"). Especially, for a high luminance, longtime operation, $(Re_{1-x}Sm_x)_3(Al_{1-y}Ga_y)_5O_{12}:Ce$ ($0 \leq x<1$, $0 \leq y=1$, where Re represents at least one element selected from the group consisting of Y, Gd, and La) and the like is preferable.

A fluorescent material, $(Re_{1-x}Sm_x)_3(Al_{1-y}Ga_y)_5O_{12}:Ce$, has a garnet structure so that it is resistant to heat, light, and moisture, and the peak wavelength of its excitation spectrum can be adjusted, for example, in the vicinity of 470 nm. In addition, the luminescent peak wavelength is in the vicinity of 530 nm and it is possible to make a broad emission spectrum which tails to about 720 nm.

In the light emitting device of the present invention, the fluorescent material may be composed of the mixture of at least two kinds.

That is, two or more kinds of phosphors of $(Re_{1-x}Sm_x)_3(Al_{1-y}Ga_y)_5O_{12}:Ce$ which include Al, Ga, Y, La, Gd and Sm in different contents can be mixed in order to increase the wavelength components of RGB. In the present state of the technology, an irregularity may occur in the emission wavelength of a semiconductor element. Therefore, at least two kinds of phosphors are mixed in order to obtain a desired mixed light in the white range and the like. Specifically, by adjusting the quantities of phosphors having different color points in accordance with the emission wavelength of the light emitting element, emission of an arbitrary color point on the chromaticity diagram can be obtained.

Such phosphors can be dispersed in a gaseous or liquid phase and discharged uniformly. Phosphors in a gaseous or liquid phase settle down by self-weight. Especially in a liquid phase, a layer including a phosphor with a higher homogeneity can be formed by leaving the suspension standing. A desired amount of phosphors can be formed by repeating the above process multiple times according to the object.

On the surface of the light emitting element, at least two kinds of phosphors described above may be included in the wavelength conversion member made of single layer or at least one kind of such phosphor may be included in each layer of the wavelength conversion member made of two layers respectively. Thus, a white light made by mixing light from different kinds of phosphors can be obtained. It is preferable that the mean particle diameter and the shape of the phosphors to be similar in order to improve mixing lights emitted from each phosphor and to decrease irregularity in color tone. Here, in the present invention, the particle size of the phosphor is the value obtained by the volume based particle size distribution curve. The volume based particle size distribution curve is obtained by measuring the particle size distribution of the phosphor by way of laser diffraction-scattering method. Specifically, under the condition where the ambient temperature is 25° C. and the humidity is 70%, a phosphor is dispersed in a sodium hexametaphosphate aqueous solution having a concentration of 0.05%. The particle size distribution is then measured with a laser diffraction scattering-type apparatus (SALD-2000A, Shimadzu Corp.) in a particle size range from 0.03 μm to 700 μm.

The fluorescent material used in the present embodiment may be a combination of a yttrium aluminum garnet phosphor typified by a YAG phosphor and a phosphor capable of emitting light in red region, especially a nitride phosphor. These YAG phosphors and the nitride phosphors can be included as a mixture in the wavelength conversion member or individually included in each layer of the wavelength conversion member composed of a plurality of layers. Now, each phosphor will be described in detail below.

(Aluminum Garnet Phosphor)

The aluminum garnet phosphor used in the present embodiment may be a phosphor that contains Al, at least one element selected from Y, Lu, Sc, La, Gd, Tb, Eu and Sm, and one element selected from Ga and In, and activated with at least one element selected from the rare-earth elements. The phosphor is excited by the visible light or ultraviolet rays emitted from the light emitting element and therefore the phosphor emits light. For example, in addition to the YAG phosphor described above, $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, $Y_{2.90}Ce_{0.05}Pr_{0.05}Al_5O_{12}$ or the like, can be used. Among them, at least two kinds of yttrium aluminum oxide phosphors of different composition, each containing Y and activated with Ce or Pr can be used.

A desired white light can be displayed by mixing light in the blue range emitted from the light emitting element using a nitride compound semiconductor as the light emitting layer with light in the green range and the red range or light in the yellow range with a green hue or a red hue emitted from a phosphor having a yellow body color in order to absorb the blue light. In the present embodiment, the light emitting device may include a phosphor as powder or bulk in various resins such as an epoxy resin, an acrylic resin, and a silicon resin, or a transparent inorganic resin such as silicon oxide, aluminum oxide in order to mix lights described above. Such a material which contains a phosphor can be used in various shapes according to the usage, for example, dots or layer formed thin enough to allow the light from the LED chip to penetrate. A desired color tone such as incandescent color and white color can be obtained by variously adjusting the ratio, coating amount, filling amount of the phosphor and the transparent inorganic material, and selecting the emission wavelength of the light emitting element.

Moreover, a light emitting device capable of emitting light efficiently can be made by sequentially disposing two or more kinds of phosphors respectively in relation to the incident light from the light emitting element. That is, when the light emitting element includes a reflecting member, the reflected light can be used efficiently. This is obtained, for example, by stacking a wavelength conversion member which includes a phosphor which absorbs light in a long wavelength range and capable of emitting light having long wavelength and other wavelength conversion member which absorbs light with longer wavelength and capable of emitting light having a much longer wavelength.

When a YAG phosphor is used, a light emitting device having high efficiency and sufficient light resistance can be obtained, even in the case where the YAG phosphor is disposed in contact with or in close proximity to a LED chip with the irradiance (Ee) in the range from 0.1 $W \cdot cm^{-2}$ to 1000 $W \cdot cm^{-2}$ inclusive.

A YAG phosphor used in the present embodiment is a yttrium aluminum oxide phosphor activated with cerium and capable of emitting light in the green region. This YAG phosphor has a garnet structure, and therefore it is resistant to heat, light, and moisture, so that its peak wavelength of its excitation-absorption spectrum can be adjusted in the vicinity from 420 nm to 470 nm. In addition, this fluorescent material emits light having a broad emission spectrum which tails to about 700 nm and a peak emission wavelength λp of about 510 nm.

A YAG phosphor made of a yttrium aluminum oxide phosphor activated with cerium and capable of emitting light in the red region also has a garnet structure, and therefore it is resistant to heat, light, and moisture, so that its peak wavelength of excitation-absorption spectrum can be adjusted in the vicinity from 420 nm to 470 nm. In addition, this fluorescent material emits light having a broad emission spectrum which tails to about 750 nm and a peak emission wavelength λp of about 600 nm.

The emission spectrum of a YAG phosphor which has a garnet structure shifts to the shorter wavelength side by substituting a part of Al with Ga in its composition, and shifts to the longer wavelength side by substituting a part of Y with Gd and/or La in its composition. Continuous adjustment of the emission color can be made by varying the composition as described above. Therefore, a YAG phosphor having a garnet structure provides the ideal condition for converting light in white range by using blue light emitted from the nitride semiconductor, such as the luminous intensity in the long-wavelength side can be changed continuously by the composition ratio of Gd. When the substitution ratio of Y is less than 20%, the green component increases and the red component decreases in the emission. When the substitution ratio of Y is greater than 80%, the red composition in the emission increases, however, the luminance drops sharply.

Similarly, the excitation-absorption spectrum shifts to the shorter wavelength side by substituting a part of Al with Ga, and to the longer wavelength side by substituting a part of Y with Gd and/or La, in the composition of YAG phosphor having the garnet structure. The peak wavelength of the excitation-absorption spectrum of YAG phosphor is preferably in the shorter side than the peak wavelength of the emission spectrum of the light emitting element.

With this construction, when the electric current applied to the light emitting element is increased, the peak wavelength of the excitation-absorption spectrum becomes approximately the same as the peak wavelength of the emission spectrum of the light emitting element. As a result, a light emitting device capable of controlling a deviation from the intended chromaticity can be obtained without decreasing the excitation efficiency of the phosphor.

The raw material for making such a phosphor is made in such a way that sufficiently mixes oxides of Y, Gd, Ce, La, Al, Sm, Pr, Tb, and Ga or compounds which can be converted into these oxides at high temperature as raw materials for Y, Gd, Ce, La, Al, Sm, Pr, Tb, and Ga, in accordance with the stoichiometric ratio. The mixture material may also be made by dissolving rare earth elements of Y, Gd, Ce, La, Sm, Pr, and Tb in an acid at the stoichimetric ratios to obtain a solution, coprecipitating the solution with oxalic acid, and firing the coprecipitation to obtain an oxide of the coprecipitate, and then mixing it with aluminum oxide and gallium oxide. The obtained raw material is mixed with an appropriate amount of fluoride, such as ammonium fluoride used as a flux, and is charged into a crucible and fired at from 1350 to 1450° C. in air for 2 to 5 hours to obtain the calcinated material. The calcinated material is then ball-milled in water, washed, separated, dried, and finally, sieved thereby obtaining the phosphor.

In the production method of the phosphor in another embodiment, the firing is preferably carried out in two steps. The first step includes firing the mixture of the raw materials for the phosphor and the flux in air or in a weak reduction atmosphere. The second step includes firing them in a reduction atmosphere. Here, a weak reduction atmosphere means an atmosphere containing at least the necessary amount of oxygen for the reaction process to form a desired phosphor from the mixed raw material. By carrying out the first firing step in the weak reduction atmosphere until the formation of the desired structure for the phosphor has completed, darkening of the phsophor and deterioration in its light absorbing efficiency can be prevented. Also, the reducing atmosphere in the second firing step means a reducing atmosphere stronger in the degree of reduction than the above discussed weak reducing atmosphere. Thus, by firing in two steps, a phosphor having excellent absorption efficiency of the excitation wavelength can be obtained.

Therefore, when a light emitting device is formed by using such a phosphor made as described above, the amount of the phosphor necessary to obtain the desired color tone can be reduced while achieving an excellent light extraction efficiency.

At least two kinds of yttrium aluminum oxide phosphors activated with cerium and having different compositions may be disposed in a mixture or used individually. When the phosphors are used individually, it is preferable to dispose the phosphors in sequence. That is, a phosphor more efficient to absorb and emit light in a shorter wavelength is disposed closer to the light emitting element than a phosphor more efficient to absorb and emit light in a longer wavelength. By this arrangement, light can be absorbed and emitted efficiently.

(Nitride Phosphor)

As the fluorescent material in the present invention, a nitride phosphor may be used. Here, a nitride phosphor includes N, at least one element selected from Be, Mg, Ca, Sr, Ba, and Zn, and at least one element selected from C, Si, Ge, Sn, Ti, Zr, and Hf, and is activated with at least one element selected from the rare earth elements. Moreover, the nitride phosphor used in the present embodiment is a phosphor which is excited by absorbing the visible light and ultraviolet light emitted from the light emitting element and the light emitted from the YAG phosphor, and emits light.

Such phosphors can be made in various combinations. Illustrative examples of such phosphors comprise Ca—Ge—N:Eu,Z system, Sr—Ge—N:Eu,Z system, Sr—Ca—Ge—N:Eu,Z system, Ca—Ge—O—N:Eu,Zn system, Sr—Ge—O—N:Eu,Z system, Sr—Ca—Ge—O—N:Eu,Z system, Ba—Si—N:Eu,Z system, Sr—Ba—Si—N:Eu,Z system, Ba—Si—O—N:Eu,Z system, Sr—Ba—Si—O—N:Eu,Z system, Ca—Si—C—N:Eu,Z system, Sr—Si—C—N:Eu,Z system, Sr—Ca—Si—C—N:Eu,Z system, Ca—Si—C—O—N:Eu,Z system, Sr—Si—C—O—N:Eu,Z system, Sr—Ca—Si—C—O—N:Eu,N system, Mg—Si—N:Eu,Z system, Mg—Ca—Sr—Si—N:Eu,Z system, Sr—Mg—Si—N:Eu,N system, Mg—Si—O—N:Eu,Z system, Mg—Ca—Sr—Si—O—N:Eu,Z system, Sr—Mg—Si—O—N:Eu,Z system, Ca—Zn—Si—C—N:Eu,Z system, Sr—Zn—Si—C—N:Eu,Z system, Sr—Ca—Zn—Si—C—N:Eu,Z system, Ca—Zn—Si—C—O—N:Eu,Z system, Sr—Zn—Si—C—O—N:Eu,Z system, Sr—Ca—Zn—Si—C—O—N:Eu,Z system, Mg—Zn—Si—N:Eu,Z system, Mg—Ca—Zn—Sr—Si—N:Eu,Z system, Sr—Zn—Mg—Si—N:Eu,Z system, Mg—Zn—Si—O—N:Eu,Z system, Mg—Ca—Zn—Sr—Si—O—N:Eu,Z system, Sr—Mg—Zn—Si—O—N:Eu,Z system, Ca—Zn—Si—Sn—C—N:Eu system, Sr—Zn—Si—Sn—C—N:Eu,Z system, Sr—Ca—Zn—Si—Sn—C—N:Eu,Z system, Ca—Zn—Si—Sn—C—O—N:Eu,Z system, Sr—Zn—Si—Sn—C—O—N:Eu,Z system, Sr—Ca—Zn—Si—Sn—C—O—N:Eu,Z system, Mg—Zn—Si—Sn—N:Eu,Z system, Mg—Ca—Zn—Sr—Si—Sn—N:Eu,Z system, Sr—Zn—Mg—Si—Sn—N:Eu,Z system, Mg—Zn—Si—Sn—O—N:Eu,Z system, Mg—Ca—Zn—Sr—Si—Sn—O—N:Eu,Z system, and Sr—Mg—Zn—Si—Sn—O—N:Eu,Z system.

Here, Z represents the rare earth elements and preferably includes at least one element of Y, La, Ce, Pr, Nd, Gd, Tb, Cy, Ho, Er, and Lu. However, Z may include Sc, Sm, Tm, and Yb. These rare earth elements are mixed in the raw materials as an elementary substance, or as an oxide, an imide, or an amide. The rare earth elements mainly have the stable trivalent electron construction. However, Yb, Sm etc. have the bivalent electron construction and Ce, Pr, Tb etc. have the quadrivalent electron construction.

When an oxide of a rare earth element is used, oxygen affects the luminescence property of the phosphor. That is, the inclusion of oxygen may cause deterioration of the luminance brightness. On the other hand, there is an advantage of shortening the afterglow and the like. However, when Mn is used, the particle diameter increases by the flux effect of Mn and O, so that the luminance brightness can be improved.

For example, La is used as a coactivator. Lanthanum oxide ($La_2O_3$) is a white crystal and rapidly converts into the carbonate when left in the air. Therefore, lanthanum oxide is kept in an inactive gas environment. For example, Pr is used as a coactivator. Different from the typical rare earth oxide of $Z_2O_3$, praseodymium oxide ($Pr_6O_{11}$) is a nonstoichiometric oxide and obtained as a black powder with the composition of $Pr_6O_{11}$, by heating the oxalate, the hydroxide, the carbonate and the like of praseodymium in the air at approximately 800° C. $Pr_6O_{11}$ is used for the starting material of the praseodymium compound synthesis, and $Pr_6O_{11}$ of high purity is available in the market.

The phosphor used in the present invention is especially of the silicon nitride system such as Sr—Ca—Si—N:Eu, Ca—Si—N:Eu, Sr—Si—N:Eu, Sr—Ca—Si—O—N:Eu, Ca—Si—O—N:Eu, Sr—Si—O—N:Eu, with Mn added. The basic composition of this phosphor is described in the general formula $L_XSi_YN_{(2/3X+4/3Y)}$:Eu or $L_XSi_YO_ZN_{(2/3X+4/3Y-2/3Z)}$:Eu (L represents Sr and Ca, or Sr or Ca)(both of Sr and Ca, or either of Sr or Ca). In the general formula, X and Y are preferably satisfying X=2, Y=5 or X=1, Y=7; however, an arbitrary value may be applied. Specifically, phosphors having the basic compositions described as $(Sr_XCa_{1-x})_2Si_5N_8$:Eu, $Sr_2Si_5N_8$:Eu, $Ca_2Si_5N_8$:Eu, $Sr_XCa_{1-X}Si_7N_{10}$:Eu, $SrSi_7N_{10}$:Eu, and $CaSi_7N_{10}$:Eu, each preferably use additional Mn; however, the composition of the phosphor may include at least one selected from the group consisting of Mg, Sr, Ca, Ba, Zn, B, Al, Cu, Mn, Cr, and Ni. However, the present invention is not to be construed to limit the scope of the embodiment and the examples.

L represents Sr and Ca, or Sr or Ca. The ratio of Sr and Ca can be changed according to the object.

By incorporating Si into the composition, a phosphor having good crystallinity can be obtained at a moderate price.

Europium Eu, which is a rare earth element, is used for the luminescence center. Europium typically has bivalent and trivalent energy levels. In the phosphor according to the present invention, $Eu^{2+}$ is used as an activator for the parent material of alkaline earth metal-base silicon nitride. $Eu^{2+}$ is susceptible to oxidation, and available in the market as trivalent $Eu_2O_3$. However, the involvement of O is great in the commercially available $Eu_2O_3$ and a desirable phosphor is difficult to obtain. Therefore, it is desirable to eliminate O from $Eu_2O_3$ before use. For example, it is desirable to use elemental europium or europium nitride. However, this need not apply when Mn is added.

Illustrative examples of the phosphors which can be produced comprise $Sr_2Si_5N_8$:Eu,Pr, $Ba_2Si_5N_8$:Eu,Pr, $Mg_2Si_5N_8$:Eu,Pr, $Zn_2Si_5N_8$:Eu,Pr $SrSi_7N_{10}$:Eu,Pr, $BaSi_7N_{10}$:Eu,Ce, $MgSi_7N_{10}$:Eu,Ce, $ZnSi_7N_{10}$:Eu,Ce, $Sr_2Ge_5N_8$:Eu,Ce, $Ba_2Ge_5N_8$:Eu,Pr, $Mg_2Ge_5N_8$:Eu,Pr, $Zn_2Ge_5N_8$:Eu,Pr, $SrGe_7N_{10}$:Eu,Ce, $BaGe_7N_{10}$:Eu,Pr, $MgGe_7N_{10}$:Eu,Pr, $ZnGe_7N_{10}$:Eu,Ce, $Sr_{1.8}Ca_{0.2}Si_5N_8$:Eu,Pr, $Ba_{1.8}Ca_{0.2}Si_5N_8$:Eu,Ce, $Mg_{1.8}Ca_{0.2}Si_5N_8$:Eu,Pr, $Zn_{1.8}Ca_{0.2}Si_5N_8$:Eu,Ce, $Sr_{0.8}Ca_{0.2}Si_7N_{10}$:Eu,La, $Ba_{0.8}Ca_{0.2}Si_7N_{10}$:Eu,La, $Mg_{0.8}Ca_{0.2}Si_7N_{10}$:Eu,Nd, $Zn_{0.8}Ca_{0.2}Si_7N_{10}$:Eu,Nd, $Sr_{0.8}Ca_{0.2}Ge_7N_{10}$:Eu,Tb $Ba_{0.8}Ca_{0.2}Ge_7N_{10}$:Eu,Tb, $Mg_{0.8}Ca_{0.2}Ge_7N_{10}$:Eu,Pr, $Zn_{0.8}Ca_{0.2}Ge_7N_{10}$:Eu,Pr $Sr_{0.8}Ca_{0.2}Si_6GeN_{10}$:Eu,Pr, $Ba_{0.8}Ca_{0.2}Si_6GeN_{10}$:Eu,Pr, $Mg_{0.8}Ca_{0.2}Si_6BaN_{10}$:Eu,Y, $Zn_{0.8}Ca_{0.2}Si_6GeN_{10}$:Eu,Y, $Sr_2Si_5N_8$:Pr, $Ba_2Si_5N_8$:Pr, $Sr_2Si_5N_8$:Tb, $BaGe_7N_{10}$:Ce. However, the present invention is not limited by the above examples.

Mn, which is an additive, accelerates the diffusion of $Eu^{2+}$, and thereby improves the luminous efficiency such as luminescent brightness, energy efficiency, and quantum efficiency. Mn is included in a raw material, or elemental Mn or a Mn compound is included during the production process and fired with the raw materials. However, after baking, Mn is not contained or only a small amount of Mn remains among the basic component elements compared with the initial content. Thus it is considered that Mn has dispersed in the firing process.

In the basic constituent elements or with the basic constituent elements of the phosphor, at least one element selected from the group consisting of Mg, Gs, In, Li, Na, K, Re, Mo, Fe, Sr, Ca, Ba, Zn, B, Al, Cu, Mn, Cr, O and Ni, is included. These elements have effects such as enlarging the particle size or improving the luminous brightness. Moreover, B, Al, Mg, Cr, and Ni have properties capable of restraining afterglow.

The nitride phosphors described above absorb a part of the blue light emitted from the light emitting element and emit light from the yellow region to the red region. Using a nitride phosphor along with a YAG phosphor in the light emitting device having the construction described above, the light emitting device capable of mixing white light with a warm-color hue is provided. This color of light is made by mixing the blue light emitted from the light emitting element and the light in the yellow to red region emitted from the nitride phosphor. The phosphor added to the device other than the nitride phosphor preferably includes yttrium aluminum oxide phosphor activated with cerium. It is because a desired chromaticity can be obtained by including the yttrium aluminum oxide phosphor.

The yttrium aluminum oxide phosphor activated with cerium absorbs a part of blue light emitted from the light emitting element and emits light in the yellow range. Here, the blue light emitted from the light emitting element and the yellow light emitted from the yttrium aluminum oxide phosphor are mixed. Thus, bluish white light is emitted. Therefore, both of the yttrium aluminum oxide phosphor and a phosphor that emits red light are mixed in the transparent coating member 101. Thus, the light emitting device that emits mixed light in white region can be provided by combining the light emitted from the phosphors and the blue light emitted from the light emitting element.

It is especially desirable for the light emitting device that the emission color is white and its chromaticity is located on the blackbody locus. However, the amounts of yttrium aluminum oxide phosphor and the phosphor emits red light can be arbitrarily adjusted in order to obtain the light emitting device having a desired color temperature. The light emitting device that emits a mixed light in white range is designed to improve the special color rendering index R9.

A conventional light emitting device emits light in the white range using only the combination of the blue light emitting element and the yttrium aluminum oxide phosphor activated with cerium provides the special color rendering index R9 of approximately 0 in the vicinity of the color temperature Tcp of 4600K so that the red element was insufficient. For this reason, improvement in the special color rendering index R9 has been an object of the present invention. In the present invention, the special color rendering index R9 can be improved to approximately 40 in the vicinity of the color temperature Tcp of 4600K, by employing a phosphor that emits red light and a yttrium aluminum oxide phosphor.

Next, the production method of the phosphor $((Sr_XCa_{1-x})_2Si_5N_8:Eu)$ of the present invention will be described, however, the production method is not limited to the method that is described below. The phosphor described above includes Mn and O.

The raw materials of Sr and Ca are ground. It is preferable to use elemental Sr and Ca for the raw materials, however, a compound such as an imide and an amide can be used. Also, the raw materials of B, Al, Cu, Mg, Mn, MnO, $Mn_2O_3$, $Al_2O_3$, or the like, may be included in the raw materials of Sr and Ca. The raw materials of Sr and Ca are ground in a glove box in an argon atmosphere. The average particle diameter of ground Sr and Ca is preferably from about 0.1 μm to 15 μm, however, it is not limited to this range. The purity of Sr and Ca is preferably 2N and above, however, it is not limited to this grade. In order to improve the mixed state, a raw material may be prepared by forming an alloy of at least one of metallic Ca, metallic Sr, and metallic Eu, and then forming a nitride compound thereof and grinding it.

The Si raw material is ground. It is preferable to use elemental Si, however, a nitride, an imide, an amide, or the like, can also be used. For example, $Si_3N_4$, $Si(NH_2)_2$, $Mg_2Si$ or the like, can be used. The purity of Si is preferably 3N and above, however, a compound such as $Al_2O_3$, Mg, metallic borate ($CO_3B$, $Ni_3B$, CrB), manganese oxide, $H_3BO_3$, $B_2O_3$, $Cu_2O$, CuO, or the like, can also be included. Si is also ground in an argon or nitrogen atmosphere in a glove box. The average particle diameter of the Si compound is preferably from about 0.1 μm to 15 μm.

Next, nitride compounds of Sr and Ca are formed in a nitrogen atmosphere. The reaction formulas are shown by the following reaction formulas (1) and (2), respectively.

Forming a nitride of Sr and Ca is carried out in a nitrogen atmosphere at 600 to 900° C. for about 5 hours. Nitrides of Sr and Ca can be formed either as a mixture or individually. Thus, nitrides of Sr and Ca can be obtained. The nitrides of Sr and Ca are preferably of a high purity, however, a commercially available material can also be used.

Next, forming a nitride of a Si raw material is carried out in a nitrogen atmosphere. The reaction formula is shown by the following reaction formula (3).

$$3Si + 2N_2 \rightarrow Si_3N_4 \quad (3)$$

A nitride of Si can be made in a nitrogen atmosphere at 800 to 1200° C. for about 5 hours. Thus, silicon nitride is obtained. The silicon nitride used in the present invention is preferably of a high purity, however, a commercially available material can also be used.

Grinding is carried out on the nitride of Sr, Ca, or Sr—Ca. A nitride of Sr, Ca, or Sr—Ca is ground in an argon or nitrogen atmosphere in a glove box.

Similarly, grinding is carried out for the nitride of Si. Also, an Eu compound, $Eu_2O_3$ is ground as well. Europium oxide is used as Eu compound, however, metallic europium, nitride europium, or the like, can also be used. An imide and amide compound can be used as the raw material Z. It is preferable to use europium oxide having a high purity, however, a commercially available grade can also be used. After grinding, the average diameter of the nitride of the alkaline-earth metal, silicon nitride and europium oxide is preferably from about 0.1 μm to 15 μm.

The raw materials described above can include at least one selected from the group consisting of Mg, Sr, Ca, Ba, Zn, B, Al, Cu, Mn, Cr, O and Ni. Also, the above elements such as Mg, Zn, and B may be mixed in the mixing process described below, in a predetermined mixing ratio. The elements described above can be added to the raw material individually, however, they are usually added as a compound. This kind of compound includes $H_3BO_3$, $Cu_2O_3$, $MgCl_2$, $MgO \cdot CaO$, $Al_2O_3$, a metallic boride (CrB, $Mg_3B_2$, $AlB_2$, MnB), $B_2O_3$, $Cu_2O$, CuO, or the like.

After grinding, nitrides of Sr, Ca, and Sr—Ca, silicon nitride, and $Eu_2O_3$ as a compound of Eu are mixed, then, Mn is added. Because the mixture of these materials is susceptible to oxidation, the mixing process is carried out in an argon or a nitrogen atmosphere, in a glove box.

Finally, the mixture of the nitrides of Sr, Ca, Sr—Ca, silicon nitride, and $Eu_2O_3$ as a compound of Eu is fired in a nitrogen atmosphere. By firing, a phosphor represented by $(Sr_xCa_{1-x})_2Si_5N_8$:Eu with additional Mn can be obtained. The composition of the objective phosphor can be changed by varying the mixing ratio of each raw material.

A tubular furnace, a compact furnace, a high-frequency furnace, a metal furnace, or the like, can be used for firing. The firing can be carried out in the temperature range from 1200 to 1700° C., however, the range from 1400 to 1700° C. is more preferable. A one step firing method is preferable. That is, the furnace temperature is gradually increased and the firing is carried out at 1200 to 1500° C. for several hours. However, a two step firing method (a multistage firing) can also be used. In the two step firing method, the first firing step is carried out at 800 to 1000° C., then, the furnace temperature is gradually increased, and the second firing step is carried out at 1200 to 1500°C. The raw material of the phosphor is preferably fired using a crucible or a boat made of boron nitride (BN). Other than a crucible of boron nitride material, an alumina ($Al_2O_3$) crucible can also be used. Using the above production process, the desired phosphor can be obtained.

In the present example of the invention, a nitride phosphor is especially used as a phosphor capable of emitting reddish light. However, in the present invention, it is possible to provide a light emitting device having a YAG phosphor described above and a phosphor capable of emitting light in the red region. Such a phosphor capable of emitting light in the red region is a phosphor excited by a light having wavelength from 400 to 600 nm and emits light. $Y_2O_2S$:Eu, $La_2O_2S$:Eu, CaS:Eu, SrS:Eu, ZnS:Mn, ZnCdS:Ag, Al, and ZnCdS:Cu, Al etc. are examples of such a phosphor. Thus, the color rendering property of the light emitting device can be improved by using a phosphor capable of emitting light in red region together with a YAG phosphor.

The phosphors capable of emitting light in the red region are typified by aluminum garnet phosphors and nitride phosphors, produced as described above. These phosphors can be included in the single phosphor layer where more than two kinds of phosphors are included, or they can be included in the two layers of phosphor where each layer includes one or more than one kind of phosphor, formed around the light emitting element. According to such a construction, a mixed light made up of light emitted from different kinds of phosphors can be obtained. Here, in order to improve the mixing of light emitted from each phosphor and to decrease the unevenness of the light, it is preferable that each kind of phosphor has a similar average grain size and shape. Also, it is preferable to dispose the nitride phosphor closer to the light emitting element than the YAG phosphor.

This is done because of consideration of the nitride phosphor absorbing a portion of light that is a converted wavelength from the YAG phosphor. Thus, the color rendering property of the mixed light can be improved compared to the case in which a mixture of a YAG phosphor and a nitride phosphor are included.

(Alkaline Earth Metal Salt Phosphor)

The light emitting device according to the present embodiment may include an alkaline earth metal salt activated with europium as a fluorescent material that absorbs a part of emission from the light emitting element and emits light having different wavelength thereof. An alkaline earth metal orthosilicate having general formula shown in the following is preferable for the alkaline earth metal salt.

$(2-x-y)SrO \cdot x(Ba, Ca)O \cdot (1-a-b-c-d)SiO_2 \cdot aP_2O_5 bAl_2O_3 cB_2O_3 dGeO_2$:$yEu^{2+}$ (where $0<x<1.6$, $0.005<y<0.5$, $0<a,b,c,d<0.5$), or $(2-x-y)BaO \cdot x(Sr, Ca)O \cdot (1-a-b-c-d)SiO_2 \cdot 2aP_2O_5 bAl_2O_3 cB_2O_3 dGeO_2$:$yEu^{2+}$ (where $0.01<x<1.6$, $0.005<y<0.5$, $0<a,b,c,d<0.5$).

Here, it is desirable that at least one value of a, b, c, and d is larger than 1.

As a phosphor made of an alkaline earth metal salt, the light emitting device of the present embodiment may include an alkaline earth metal aluminate activated with europium and/or manganese, Y(V,P,Si)$O_4$:Eu, or an alkaline earth metal-magnesium-bis silicate represented by the following formula, other than the alkaline earth metal silicate described above.

Me(3-x-y)MgSi$_2O_7$:xEu, yMn (where $0.005<x<0.5$, $0.005<y<0.5$, and Me represents Ba and/or Sr and/or Ca)

Next, a production process of a phosphor made of an alkaline earth metal silicate according to the present embodiment will be described.

For the production of an alkaline earth metal silicate, the stoichiometric quantities of the starting materials of alkaline earth metal carbonate, silicon dioxide, and europium oxide are thoroughly mixed according to the selected composition. Then, in a reducing atmosphere, the starting material is converted into the phosphor at 1100° C. and 1400° C., by way of a typical solid state reaction for fluorescent material production. Here, it is desirable to add less than 0.2 mol of ammonium chloride or other halide. Moreover, a portion of silicon can be substituted with germanium, boron, aluminum, phosphorus, and a portion of europium can be substituted with manganese, according to necessity.

A desired luminescent color and high color reproductivity can be obtained by using the phosphors described above, that is, one of an alkaline earth metal aluminate activated with europium and/or manganese, $Y(V,P,Si)O_4:Eu$, $Y_2O_2S:Eu^{3+}$, or combination thereof.

The positions for disposing each phosphor described above are not specifically limited and each phosphor may be disposed on the rear surface of the window portion of the rigid member, or included in each material of the rigid and flexible members. When the phosphor is adhered to the rear surface of the rigid member or the surface of the light emitting element by a binder, the material of the binder is not specifically limited and both organic and inorganic materials can be used. When an organic material is used as a binder, a transparent resin with good weather resistance, such as an epoxy resin, an acrylic resin, silicone and the like is suitably used. Especially, silicone is preferably used because silicone has a good reliability and is capable of improving the dispersion of the phosphor.

When a fluorescent material is disposed on the surface of the lens, an inorganic material which has approximately the same coefficient of thermal expansion as the binder is preferably used. Thus, the phosphor can be bonded well. Specifically, a sedimentation method and a sol-gel method etc. can be used. For example, a phosphor, silanol ($Si(OEt)_3OH$), and ethanol are mixed in order to make a slurry. The slurry is discharged from a nozzle onto the window portion of the rigid member, and then heated at 300° C. for 3 hours so as to convert silanol into $SiO_2$. With this arrangement, the phosphor is fixed at the desired place.

A binding agent of an inorganic material can also be used as a binder. A binding agent is a so-called low-melting glass. The low-melting glass preferably has fine particles, a small absorptivity in the radiation from the ultraviolet region to the visible region, and excellent stability in the binder. An alkaline earth borate with fine particles obtained by sedimentation method is suitable.

For bonding a phosphor of a large particle size, it is preferable to use a binding agent which has ultrafine particles, even if it has a high melting point. Specific examples of such a binding agent are silica and alumina made by Degussa, or a pyrophosphate and an orthophosphate of an alkaline earth metal with fine particles obtained by a sedimentation method. These binding agents can be used singly or in combination.

Here, an coating method of the binding agent will be described. To enhance binding effect, it is preferable to prepare the binding slurry by wet-grinding the binding agent in a vehicle. The vehicle is a high viscosity solution made by dissolving a small amount of a binding agent in an organic solvent or deionized water. For example, an organic vehicle can be prepared by dissolving 1 wt % of nitrocellulose in butyl acetate which is an organic solvent.

The coating medium is made by adding the phosphor to the binding slurry. In the coating medium, an additional ratio of slurry may be set so that the amount of the binding agent in the slurry is about 1 to 3 wt % with respect to the phosphor. An excessive amount of binding agent may cause a decrease in the lumen maintenance factor. Therefore, it is preferable to use the binding agent with a minimum amount.

To dispose the phosphor on the rear surface or the main surface of the rigid member by using the binding agent, the coating medium is applied on the rear surface of the window portion. Then, the coating medium is dried by blowing a warm or hot current of air. Finally, the vehicle is vaporized by baking at from 400° C. to 700° C. With this arrangement, the phosphor layer is adhered to the surface of the window portion by the binding agent.

(Dispersing Agent)

In the present invention, a dispersing agent may be included in the wavelength conversion member along with the phosphor. Barium titanate, titanium oxide, aluminum oxide, silicon oxide, and a mixture including at least two of them and the like are preferably used as the dispersing agent. With this, the light emitting device having a desired directional pattern can be obtained.

In the present specification, a dispersing agent has a center particle diameter from 1 nm and greater to less than 5 μm. It is preferable because the dispersing agent of this size diffusely reflects the light from the light emitting element and the phosphor, and irregularity in color incidental to a phosphor having a large particle size can be controlled. The half-width of the luminescent spectrum can be reduced and the light emitting device having a high color purity can be obtained. A dispersing agent having particles from 1 nm to less than 1 μm has a low interference effect to the light wavelength of the light emitting element. On the other hand, such a dispersing agent has a high transparency and can enhance a viscosity of a resin without decreasing the luminosity. With this arrangement, an almost uniform dispersion of the phosphor in the resin and sustaining the uniformity in the syringe can be obtained in the case where the wavelength conversion member is disposed by way of wire coating or potting and the like. Therefore, production with a good process yield can be achieved even when using a phosphor having a large particle size, which is relatively difficult to handle. Thus, dispersing agents used in the present invention have different effects according to their diameter range. Therefore, the dispersing agents can be used by selecting or combining them in accordance with the intended use.

(Filler)

In the present invention, a filler may be included in the wavelength conversion member in addition to the phosphor. The filler is similar to the dispersing agent in material and different from the dispersing agent in the center diameter. In this specification, the fillers are particles of which the center particle diameter is in a range from 5 μm to 100 μm inclusive. When a filler having such particle size is included in a transparent resin, an irregularity in chromaticity caused by light scattering effect can be controlled, and the thermal shock resistance of the transparent resin can also be enhanced.

With this construction, disconnection of wires which electrically connect the light emitting element and the external electrode, and detachment of the bottom surface of the light emitting element from the bottom surface of the recess of the package and the like can be prevented even under a high temperature operation. Thus, the light emitting device having a high reliability in high temperature operation can be obtained. Moreover, the fluidity of the resin can be maintained constantly for a long time so that the encapsulating member can be disposed to a desired position. As a result, quantity production with a good production yield becomes possible.

It is preferable that a filler has a similar particle size and/or shape to that of the phosphor. In the present specification, a similar particle size means the difference of the respective center particle sizes is less than 20%. A similar particle shape means the difference of the respective circularities is less than 20%. Circularity shows a degree of approximation of a particle to a perfect circle. (circularity=circumference of a perfect circle having the equal area to the projected area of the particle/circumference of the projection of the particle).

By using such a filler, the phosphor and the filler affect each other and the phosphor can be dispersed well in the resin, so that occurrence of irregularity in color can be prevented. Moreover, the center particle sizes of the phosphor and the filler are preferably from 15 μm to 50 μm, more preferably from 20 μm to 50 μm. By adjusting the particle size in such range, the particles can be disposed with a suitable spacing among the particles. As a result, the light extraction route can be secured, and the directivity can be improved while preventing deterioration in the luminosity caused by incorporation of the filler.

[Conductive Wire 109]

In the present embodiment, the conductive wire means a conductive material that connects an electrode of the light emitting element 108 or the protective element 107 and a lead electrode. After die bonding the light emitting element 108 on the lead frame in order to fix it, each of the electrodes of the light emitting element can be connected by the conductive wires.

Here, the cementing material used in die bonding is not specifically limited and insulating adhesives such as epoxy resin, Au—Sn alloy, resin or glass containing conductive material, or the like, can be used. It is preferable to use Ag as the conductive material. A light emitting device having excellent heat dissipation and having a low stress after cementing can be obtained by employing Ag paste with 80% to 90% Ag content.

For the conductive wires, excellent properties for ohmic contact, mechanical connectivity as well as electric and thermal conductivity with the electrodes of the light emitting element are required. For the thermal conductivity, 0.01 cal/(s) (cm$^2$) (° C./cm,) or greater is preferable, and 0.5 cal/(s) (cm$^2$) (° C./cm) or greater is more preferable.

In addition, it is preferable that the diameter of the conductive wires be greater than or equal to Φ10 μm and less than or equal to Φ45 μm in view of efficiency. Especially, the conductive wires are susceptible to detachment at the interface of the coating which includes the fluorescent material, and the mold member.

Even when the same material is used for both the coating portion and the molding portion, the fluorescent material is believed to be the cause of the detachment due to a difference in thermal expansion. For this reason, the diameter of the conductive wires is preferably greater than or equal to 25 μm. For the reasons of enlarging the light emitting area and ease of handling, the diameter of the conductive wires is preferably less than or equal to 35 μm. The conductive wire can be a wire made of a metal such as gold, copper, platinum, and aluminum, or the like, or an alloy using these metals.

The conductive wire is preferably wire-bonded at least twice in the bonding region. That is, it is preferable that after making the first stitchbonding in the bonding region, a wire ball is formed by drawing out the wire from the capillary once again, and the second stitchbonding is made adjacent to the first stitchbonding portion in the same bonding region. With this construction, the thermal shock resistance of the conductive wire is improved and a semiconductor device having a high reliability can be obtained.

EXAMPLES

The invention will be understood in detail with reference to the following examples. However, these examples are not to be construed to limit the scope of the invention.

Example 1

As shown in FIG. 2, a surface mounting type of light emitting device (SMD) is formed. The LED chip 108 is a nitride semiconductor light emitting element including an active layer of an $In_{0.2}Ga_{0.8}N$ semiconductor with a monochromatic emission peak being a visible color of 475 nm.

In more detail, the LED chip 108 is formed by growing the nitride semiconductors on a clean sapphire substrate by MOCVD method using TMG (trimethyl-gallium) gas, TMI (trimethyl-indium) gas, nitrogen gas and dopant gas along with a carrier gas. The layers of the n-type nitride semiconductor or the p-type nitride semiconductor are formed by switching the dopant gas between $SiH_4$ and $Cp_2Mg$.

The elemental structure of the LED chip 108 of the present example is sequentially formed on a sapphire substrate. The layers include a GaN layer of an undoped nitride semiconductor, a contact layer of n-type GaN layer having an n-type electrode doped with Si, a GaN layer of undoped nitride semiconductor, and an active layer having a multi-quantum-well structure comprising 5 sets of sequentially formed layers of a GaN barrier layer and an InGaN well layer, and a GaN barrier layer on top of the 5 sets of layers. An AlGaN layer as a Mg-doped p-type cladding layer and a p-type GaN layer as a Mg-doped p-type contact layer are sequentially formed on the active layer. Furthermore, a GaN buffer layer is formed on the sapphire substrate using a low temperature. Also, after forming the layers, the p-type semiconductor is annealed at greater than or equal to 400° C.

The surfaces of the p-type contact layer and the n-type contact layer of the nitride semiconductor on the sapphire substrate are exposed by etching them on the same surface side. Next, sputtering is performed on the p-type contact layer using Rh and Zr. Thus a diffusion electrode having a pattern is formed.

Further, sputtering process using W, Pt and Au are carried out on the diffusion electrode and a portion of the n-type contact layer to sequentially form the layers of W/Pt/Au in this sequence. This allows concurrent formation of the p-side pad electrode and the n-side pad electrode. Here, by concurrently forming the p-side pad electrode and n-side pad electrode, the number of process steps for forming the electrodes can be reduced.

In addition, the p-side pad electrode can also be formed on a portion of the transparent electrode, after forming an ITO (complex oxide of indium (In) and tin (Sn)), a metallic thin film of Ni/Au, or the like, as a transparent electrode on the entire surface of the p-type nitride semiconductor.

After scribing on the semiconductor wafer made as described above, each LED chip (photorefractive index of 2.5) of the semiconductor light emitting element is made by dividing the wafer with an external force.

Punching is carried out on a long metal frame of copper including iron which is 0.5 mm in thickness, in order to form the lead frame having a plurality of pairs of end portions of at least three metal members. In addition, Ag plating is carried out on the surface of the lead frame in order to improve the optical reflectivity.

Next, three tip portions of the metal member (the first metal member 101 whereon the LED chip 108 to be mounted, the second metal member 102 and the third metal member 103 each becomes a lead electrode) are preset in the die and then a molten polyphthalamide resin is poured in from the gate. Thereafter, the resin hardens and the molded package 100 shown in FIG. 1 is formed. The backsides of the second metal member 102 and the third metal member 103 are supported by a part of die and positioned at the time of molding. By this process, as shown in FIG. 4, the holes 114 and 115 are formed, from which the back surfaces of the second metal member 102 and the third metal member 103 are exposed from the molded package.

In addition, an injection trace 113 is formed on the rear surface of the molded package and therefore, disfigurement of the semiconductor device can be prevented. In addition, a cathode mark having a step adjacent to the emission surface is formed on the main surface of the molded package. The molded package is detached from the metal mold by pushing the four parts adjacent to the emission surface on the main surface of the molded package. At this time, the portion of the cathode mark is also pushed by a pin. However, the cathode mark is formed with a step which is partially curved to secure a sufficient contact area for the pin. With this construction of the cathode mark, the mechanical strength of the emission surface can be secured compared with the case where a step is formed without having a curved portion.

The molded package 100 includes a cylindrical first recess 120 capable of housing the LED chip 108 and the protective element 107, and step-wise differences in the vicinity of the opening of the main surface side of the inner wall of the recess 106. The positive and the negative lead electrodes are integrally molded so as to expose their main surfaces from the second main surface 1b at the bottom surface of the recess. Moreover, the main surfaces of the exposed positive and negative lead electrodes are respectively divided into two bonding regions by a wall portion made of the same material as the mold member extending from the sidewall of the first recess 120 toward the second recess 130.

Moreover, the lead electrodes 102 and 103 respectively protruding from the sidewall of the package which is adjacent to the emission surface, are bent to the degree to be on the approximately same plane as the rear surface of the molded package, so as to form the joining terminal portion with the external electrodes. As shown in FIG. 4, the first metal member 101 has an enlarged portion 101a extending in the direction almost parallel to the outer wall of the molded package from which the first metal member 101 protrudes. With this construction, the first metal member 101 can be prevented from slipping out in the direction of its insertion.

In the present example, a Zener diode 107 is used as a protective element. The Zener diode 107 having a back-face electrode is die-bonded to the bonding region 103a formed on the main surface of the negative lead electrode using a conductive bonding agent. The conductive wire 109 connecting to the Zener diode 107 is wire-bonded to the bonding region 102a formed on the main surface of the positive lead electrode. Here, the polarities of the positive and negative electrodes of the Zener diode 107 are made with a reversed polarity to the polarities of the positive and negative electrodes of the LED chip 108.

The LED chip 108 is fixed to the exposed main surface of the first metal member 101 by using an epoxy resin as a die-bonding agent. Next, the positive and the negative electrodes of the fixed LED chip 108 are connected to the bonding regions formed on the main surfaces of the positive electrode 102b and the negative electrode 103b respectively by the conductive wires which are mainly made of Au.

Here, the bonding areas formed on the main surfaces of the negative electrode 103a, 103b and the bonding areas formed on the main surfaces of the positive electrode 102a and 102b are respectively divided by the wall portion 104. The distance between each wire-bonding position is from 0.70 mm to 1.50 mm, and the width of the wall portion 104 is from 0.25 mm to 0.40 mm, which is smaller than the distance between the wire-bonding positions. Thus, the tips of capillaries are prevented from touching each other during the wire bonding process. The thickness of the wall portion 104 from the main surface of a lead electrode is from 0.20 mm to 0.50 mm.

By adjusting the thickness as just described, the die bonding material can be prevented from drifting into the adjacent bonding region that is divided by the wall portion 104, when fixing the Zener diode 107 using the die bonding material. Therefore, wire bonding to the adjacent bonding region can be easily performed in the post-processing process, and the work efficiency can be improved.

Next, a gel silicone resin is injected by potting to fill the portion from the main surface of the first metal member 101 to in the vicinity of the difference formed at the opening of the first recess 120. Furthermore, the gel silicone resin is hardened by heating to form the first encapsulating member 111. Next, a rigid silicone resin is injected to enclose the gel silicone resin. The rigid silicone resin is then hardened by heating to form the second encapsulating member 112, so as to structurally integrate each encapsulating member. Here, the top surface of the encapsulating member 112 that is structurally integrated with the encapsulating member 111 is formed approximately parallel to and lower than the main surface of the molded package 100. With this construction, a gel silicone resin having a high adhesion can be prevented from creeping up and a semiconductor device with a high reliability can be obtained.

The semiconductor device according to the present example has a high reliability owing to the structure described above, and also detachment of the encapsulating resin and disconnection of the wires are prevented.

Example 2

FIG. 5 shows a schematic top view of the semiconductor device 300 according to the present example. FIG. 6 shows a sectional view taken along dotted line VI-VI of FIG. 5. The molded package according to the present example includes a wall portion 104 between the positive lead electrode and the negative lead electrode which are exposed at the bottom surface of the recess. The main surfaces of the exposed positive and the negative electrodes are formed to the bonding area 103c and 102c respectively.

Furthermore, the light emitting element and the protective element are combined to make a compound element as the semiconductor component mounted on the package. Here, the light emitting element 108 is set so that the main surface of the transparent substrate faces the emission observation surface of the semiconductor device. The positive and the negative electrodes formed on the same side of the light emitting element are respectively facing the negative and the positive electrodes formed on the submount 301, and connected by the bumps.

Submount 301 is made of silicone and formed as a Zener diode to prevent the light emitting element 108 from destruction caused by overvoltage, and includes an p-type semiconductor region having the positive electrode and the n-type semiconductor region having the negative electrode. The positive and the negative electrodes of the submount 301 are made of aluminum and disposed on the same plane, and insulated from each other. The n-side electrode and the p-side electrode of the light emitting element 108 are placed with a reversed polarity to the positive and the negative electrodes of the submount 301, and face each other, and are bonded respectively by way of the ultrasonic bonding.

Moreover, the submount is fixed on the first metal member exposed in the bottom surface of the second recess 130, by using Ag paste as a bonding agent. The bonding regions 102c and 103cof the lead electrodes exposed in the recess are respectively connected to the positive and the negative electrodes of the submount by the conductive wires 109. Finally, the recess is sealed with a silicon resin in order to make a light emitting device. The light emitting device is constructed in the same manner as in Example 1 except for the differences described above.

As shown in the current example, light can be extracted from the transparent substrate side where no obstacles such as electrode of the light emitting element for emission exist. Therefore, the light extraction efficiency of the light emitting device can be improved. Furthermore, the light emitting device with a high reliability which is tolerant of detachment of the sealing member and conductive wires can be obtained.

Example 3

FIG. 7 is a schematic top view and FIG. 9 is a rear view of the semiconductor device 400 according to the present example. FIG. 8 is a sectional view taken along dotted line VIII-VIII of FIG. 7.

The molded package of the present example includes a first metal member 101 that is branched into two at the part where it is inserted in the mold member, and respectively protrudes from the outer wall of the molded package, as shown in FIG. 9. The mold member 105 occupies the portion between the two branches of the first metal member 101. The semiconductor device is constructed in the same manner as in examples described above, except for forming the first metal member into such a shape.

The semiconductor device according to the present example has an excellent mechanical strength in the insertion direction of the metal member, and can be mounted with stability on the other mounting substrates.

Example 4

FIG. 10 shows a schematic top view of the semiconductor device 500 according to the present example and FIG. 11 shows a sectional view taken along dotted line XI-XI in FIG. 10.

The molded package of the present example is constructed in the same manner as in Example 3 except for the way described below. That is, the entire rear surfaces of the second and the third metal members protruding from the outer wall of the molded package are adjusted to be on the same plane with the rear surfaces of the molded package and the first member 101, without bending them toward the rear surface of the package at the places where they protrude.

The semiconductor device according to the present example has an excellent mechanical strength in the insertion direction of the metal member, and can be mounted with stability on the other mounting substrates. Moreover, the heat dissipation of the semiconductor device can be improved.

Example 5

The light emitting device is constructed in the same manner as in the examples described above except for disposing a wavelength conversion member, which is an encapsulating member containing a phosphor, around the light emitting element.

The phosphor is made by dissolving rare earth elements of Y, Gd, and Ce in an acid in stoichiometric proportions, and then coprecipitating the solution with oxalic acid. The oxide of the coprecipitate obtained by firing this material is mixed with aluminum oxide to obtain a raw material mixture. The mixture was then mixed with barium fluoride used as a flux, and fired in a crucible in air at 1400° C. for 3 hours to obtain the fired material. Then the fired material is ground by a ball mill in water, washed and separated, dried, and finally sieved, thereby obtaining a phosphor having a main diameter of 8 μm, and which is represented by the general formula $(Y_{0.995}Gd_{0.005})_{2.750}Al_5O_{12}:Ce_{0.250}$.

After 5.5 wt % of the phosphor is added to the silicon resin composite described above, the composite is mixed by a rotation-revolution mixer for 5 minutes. The curing material obtained in this manner is filled in the recess to a level even with the top surface of the second recess 130. Next, a heat treatment is carried out for the composite at 70° C. for 2 hours and then at 150° C. for 1 hour to form a wavelength conversion member around the light emitting element. Finally, an epoxy resin is applied to enclose the wavelength conversion member and the lead electrodes.

The light emitting device thus produced is capable of emitting mixed light of light emitted from the light emitting element and fluorescent light emitted from the fluorescent material which absorbs the light emitted from the light emitting element and emits light in a different wavelength.

According to the present invention, detachment of the encapsulating resin and disconnection of the conductive wires can be prevented by forming a wall portion which separates the semiconductor element and the bonding regions of the conductive wires in the recess of the molded package. As a result, the semiconductor device with a high reliability can be obtained.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

The text of Japanese priority application no. 2003-176556 filed Jun. 20, 2004 is hereby incorporated by reference.

What is claimed is:

1. A molded package for a light emitting device comprising:
   a molded member having a recess formed therein with a bottom surface and a side surface;
   a positive lead electrode partially disposed on the bottom surface and adjacent to the side surface in the recess and extending outwardly from said molded member;
   a negative lead electrode partially disposed on the bottom surface and adjacent to the side surface in the recess and extending outwardly from said molded member;
   wherein a portion of said positive lead electrode and a portion of said negative lead electrode in the recess are separated from each other by a wall portion, wherein said wall portion extends inwardly in a direction toward a center of the recess.

2. The molded package according to claim 1, wherein at least one of said positive lead electrode and said negative lead electrode is divided by said wall portion.

3. The molded package according to claim 2, wherein said wall portion is integral with said molded member.

4. The molded package according to claim 2, wherein the recess includes a first recess, and wherein the bottom surface is a first bottom surface and the side surface is a first side surface and said molded package further comprising a second recess formed in the first bottom surface of the recess, the second recess including a second bottom surface and a second side surface surrounding the second bottom surface.

5. The molded package according to claim 1, wherein said wall portion is integral with said molded member.

6. The molded package according to claim 1, wherein the recess includes a first recess, and wherein the bottom surface is a first bottom surface and the side surface is a first side surface and said molded package further comprising a second recess formed in the first bottom surface of the recess, the second recess including a second bottom surface and a second side surface surrounding the second bottom surface.

7. A light emitting device comprising:
a light emitting element;
a molded member having a recess formed therein by a bottom surface and a side surface so as to mount said light emitting element in substantially a center of the recess;
a positive lead electrode partially disposed on the bottom surface and adjacent to the side surface in the recess and extending outwardly from said molded member;
a negative lead electrode partially disposed on the bottom surface and adjacent to the side surface in the recess and extending outwardly from said molded member;
means for electrically connecting said light emitting element to said positive lead electrode, and said light emitting element to said negative lead electrode;
wherein a portion of said positive lead electrode and a portion of said negative lead electrode in the recess are separated from each other by a wall portion, wherein said wall portion extends inwardly in a direction toward the center of the recess.

8. The light emitting device according to claim 7, wherein said light emitting element is mounted on at least one of said positive lead electrode and said negative lead electrode.

9. The light emitting device according to claim 7, further comprising a protective element mounted on at least one of said positive lead electrode and said negative lead electrode so as to protect said light emitting element from overvoltage.

10. The light emitting device according to claim 7, wherein at least one of said positive lead electrode and said negative lead electrode is divided by said wall portion.

11. The light emitting device according to claim 10, wherein said wall portion is integral with said molded member.

12. The light emitting device according to claim 10, wherein the recess includes a first recess, and wherein the bottom surface is a first bottom surface and the side surface is a first side surface and said molded package further comprising a second recess formed in the first bottom surface of the recess, the second recess including a second bottom surface and a second side surface surrounding the second bottom surface and said light emitting element being mounted on the second bottom surface.

13. The light emitting device according to claim 12, further comprising a first encapsulating member disposed in the second recess so as to cover said light emitting element, and a second encapsulating member disposed in the first recess so as to cover said first encapsulating member.

14. The light emitting device according to claim 10, wherein said means for electrically connecting includes a plurality of conductive wires, and said plurality of conductive wires being disposed below a top surface of said wall portion.

15. The light emitting device according to claim 10, further comprising a protective element mounted on said negative lead electrode so as to protect said light emitting element from overvoltage, and wherein said means for electrically connecting includes a wire connecting said negative lead electrode to said light emitting element, and wherein said protective element and said wire are separated from each other by said wall portion.

16. The light emitting device according to claim 10, further comprising a protective element mounted on said positive lead electrode so as to protect said light emitting element from overvoltage, and wherein said means for electrically connecting includes a wire connecting said positive lead electrode to said light emitting element, and wherein said protective element and said wire are separated from each other by said wall portion.

17. The light emitting device according to claim 10, further comprising a protective element mounted on said negative lead electrode so as to protect said light emitting element from overvoltage, wherein said means for electrically connecting includes a wire connecting said light emitting element to a first portion of said positive lead electrode, wherein a second portion of said positive lead electrode is electrically connected to the protective element, and wherein said first and second portions of said positive lead electrode are divided into at least two regions by said wall portion.

18. The light emitting device according to claim 10, further comprising a protective element mounted on said positive lead electrode so as to protect said light emitting element from overvoltage, wherein said means for electrically connecting includes a wire connecting said light emitting element to a first portion of said negative lead electrode, wherein a second portion of said negative lead electrode is electrically connected to the protective element, and wherein said first and second portions of said negative lead electrode are divided into at least two regions by said wall portion.

19. The light emitting device according to claim 10, wherein the recess includes a first recess, and wherein the bottom surface is a first bottom surface and the side surface is a first side surface and said molded package further comprising a second recess formed in the first bottom surface of the recess, the second recess including a second bottom surface and a second side surface surrounding the second bottom surface and an encapsulating member being disposed in the molded member so as to cover said light emitting element.

20. The light emitting device according to claim 19, wherein said encapsulating member includes a first encapsulating member and a second encapsulating member disposed in sequence in the recess and said second encapsulating member having a rigidity greater than a rigidity of said first encapsulating member.

21. The light emitting device according to claim 20, wherein said first encapsulating member is a gel silicone resin and said second encapsulating member is a silicone resin.

22. The light emitting device according to claim 19, wherein said encapsulating member includes a fluorescent material which is capable of absorbing light emitted from said light emitting element and converting the light absorbed by the fluorescent material to a different wavelength.

23. The light emitting device according to claim 7, wherein said wall portion is integral with said molded member.

24. The light emitting device according to claim 7, wherein the recess includes a first recess, and wherein the bottom surface is a first bottom surface and the side surface is a first side surface and said molded package further comprising a second recess formed in the first bottom surface of the recess, the second recess including a second bottom surface and a second side surface surrounding the second bottom surface and said light emitting element being mounted on the second bottom surface.

25. The light emitting device according to claim 24, further comprising a first encapsulating member disposed in the second recess so as to cover said light emitting element, and a second encapsulating member disposed in the first recess so as to cover said first encapsulating member.

26. The light emitting device according to claim 7, wherein said means for electrically connecting includes a plurality of conductive wires, and said plurality of conductive wires being disposed below a top surface of said wall portion.

27. The light emitting device according to claim 7, further comprising a protective element mounted on said negative lead electrode so as to protect said light emitting element from overvoltage, wherein said positive lead electrode is electrically connected to said protective element.

28. The light emitting device according to claim 7, further comprising a protective element mounted on said positive lead electrode so as to protect said light emitting element from overvoltage, wherein said negative lead electrode is electrically connected to said protective element.

29. The light emitting device according to claim 7, further comprising a protective element mounted on said negative lead electrode so as to protect said light emitting element from overvoltage, and said means for electrically connecting including a first wire and a second wire, wherein said negative lead electrode is electrically connected to said light emitting element by the first wire, and said positive lead electrode is electrically connected to said light emitting element by the second wire.

30. The light emitting device according to claim 7, further comprising a protective element mounted on said positive lead electrode so as to protect said light emitting element from overvoltage, and said means for electrically connecting including a first wire and a second wire, wherein said positive lead electrode is electrically connected to said light emitting element by the first wire, and said negative lead electrode is electrically connected to said light emitting element by the second wire.

31. The light emitting device according to claim 7, wherein the recess includes a first recess, and wherein the bottom surface is a first bottom surface and the side surface is a first side surface and said molded package further comprising a second recess formed in the first bottom surface of the recess, the second recess including a second bottom surface and a second side surface surrounding the second bottom surface and an encapsulating member being disposed in the molded member so as to cover said light emitting element.

32. The light emitting device according to claim 31, wherein said encapsulating member includes a first encapsulating member and a second encapsulating member disposed in sequence in the recess and said second encapsulating member having a rigidity greater than a rigidity of said first encapsulating member.

33. The light emitting device according to claim 32, wherein said first encapsulating member is a gel silicone resin and said second encapsulating member is a silicone resin.

34. The light emitting device according to claim 31, wherein wherein the side surface of the recess entirely surrounds the bottom surface of the recess and said encapsulating member includes a fluorescent material which is capable of absorbing light emitted from said light emitting element and converting the light absorbed by the fluorescent material to a different wavelength.

35. A molded package for a light emitting device comprising:
a molded member having a recess formed therein with a bottom surface and a side surface;
a positive lead electrode partially disposed on the bottom surface and adjacent to the side surface in the recess and extending outwardly from said molded member;
a negative lead electrode partially disposed on the bottom surface and adjacent to the side surface in the recess and extending outwardly from said molded member;
a wall portion separating at least one of said positive lead electrode and said negative lead electrode into two parts in the recess, wherein said wall portion extends inwardly in a direction toward a center of the recess.

36. A light emitting device comprising:
a light emitting element;
a molded member having a recess formed therein by a bottom surface and a side surface so as to mount said light emitting element in substantially a center of the recess;
a positive lead electrode partially disposed on the bottom surface and adjacent to the side surface in the recess and extending outwardly from said molded member;
a negative lead electrode partially disposed on the bottom surface and adjacent to the side surface in the recess and extending outwardly from said molded member;
means for electrically connecting said light emitting element to said positive lead electrode, and said light emitting element to said negative lead electrode;
a wall portion separating at least one of said positive lead electrode and said negative lead electrode into two parts in the recess, wherein said wall portion extends inwardly in a direction toward a center of the recess.

37. The light emitting device according to claim 36, further comprising a protective element mounted on said at least one of said positive lead electrode and said negative lead electrode so as to protect said light emitting element from overvoltage.

* * * * *